United States Patent
Collins et al.

(10) Patent No.: US 6,238,588 B1
(45) Date of Patent: *May 29, 2001

(54) HIGH PRESSURE HIGH NON-REACTIVE DILUENT GAS CONTENT HIGH PLASMA ION DENSITY PLASMA OXIDE ETCH PROCESS

(75) Inventors: Kenneth Collins, San Jose; David Groechel, Sunnyvale; Raymond Hung, San Jose; Michael Rice, Pleasanton; Gerald Yin, Cupertino; Jian Ding, San Jose; Chunshi Cui, Santa Clara, all of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/733,554

(22) Filed: Oct. 21, 1996

Related U.S. Application Data

(63) Continuation-in-part of application No. 08/648,254, filed on May 13, 1996, now Pat. No. 6,165,311, and a continuation-in-part of application No. 08/597,577, filed on Feb. 2, 1996, now Pat. No. 6,077,384, which is a continuation-in-part of application No. 08/580,026, filed on Dec. 20, 1995, which is a continuation-in-part of application No. 08/521,668, filed on Aug. 31, 1995, now abandoned, and a continuation-in-part of application No. 08/503,467, filed on Jul. 18, 1995, now Pat. No. 5,770,099, which is a continuation-in-part of application No. 08/289,336, filed on Aug. 11, 1994, now abandoned, which is a division of application No. 08/138,060, filed on Oct. 15, 1993, now Pat. No. 5,477,975, which is a continuation of application No. 08/041,796, filed on Apr. 1, 1993, now Pat. No. 5,556,501, which is a continuation of application No. 07/984,045, filed on Dec. 1, 1992, now abandoned, which is a continuation of application No. 07/722,340, filed on Jun. 27, 1991, now abandoned.

(51) Int. Cl.[7] .................................................. B44C 1/22
(52) U.S. Cl. ........................ 216/68; 216/67; 216/79; 438/707; 438/710; 438/719; 438/723; 438/725; 204/192.32; 204/192.37
(58) Field of Search .............................. 216/67, 68, 79; 438/707, 710, 719, 723, 725; 204/192.32, 192.37

(56) References Cited

U.S. PATENT DOCUMENTS

| | | | |
|---|---|---|---|
| 4,123,316 | 10/1978 | Tsuchimoto | 438/731 |
| 4,261,762 | 4/1981 | King | 438/514 |
| 4,350,578 | 9/1982 | Frieser et al. | 204/192.35 |
| 4,371,412 | * 2/1983 | Nishizawa | 156/345 |
| 4,427,516 | 1/1984 | Levinstein et al. | 204/192.38 |
| 4,427,762 | 1/1984 | Takahashi et al. | 430/436 |
| 4,430,547 | 2/1984 | Yoneda et al. | 219/121.4 |
| 4,457,359 | 7/1984 | Holden | 277/627 |
| 4,512,391 | 4/1985 | Harra | 165/48.1 |
| 4,565,601 | 1/1986 | Kakehi et al. | 216/59 |
| 4,711,698 | 12/1987 | Douglas | 438/722 |
| 4,755,345 | 7/1988 | Baity, Jr. et al. | 376/123 |
| 4,756,810 | 7/1988 | Lamont, Jr. et al. | 204/192.3 |
| 4,786,352 | 11/1988 | Benzing | 156/345 |
| 4,786,359 | 11/1988 | Stark et al. | 438/710 |
| 4,793,897 | 12/1988 | Dunfield et al. | 438/724 |
| 4,807,016 | * 2/1989 | Douglas | 204/192.37 |
| 4,810,935 | 3/1989 | Boswell | 315/111.41 |
| 4,842,683 | 6/1989 | Cheng et al. | 156/345 |
| 4,870,245 | 9/1989 | Price et al. | 219/121.36 |
| 4,918,031 | 4/1990 | Flamm et al. | 438/695 |
| 4,948,458 | 8/1990 | Ogle | 438/729 |
| 4,948,750 | 8/1990 | Kausche et al. | 438/485 |
| 4,990,229 | 2/1991 | Campbell et al. | 204/298.06 |
| 5,000,113 | 3/1991 | Wang et al. | 118/723 E |
| 5,006,220 | 4/1991 | Hijikata et al. | 204/298.33 |
| 5,015,330 | 5/1991 | Okumura et al. | 438/694 |
| 5,074,456 | 12/1991 | Degner et al. | 228/121 |
| 5,085,727 | 2/1992 | Steger | 156/345 |
| 5,169,487 | 12/1992 | Langley et al. | 438/714 |
| 5,173,151 | * 12/1992 | Namose | 438/723 |
| 5,187,454 | 2/1993 | Collins et al. | 333/17.3 |
| 5,203,956 | 4/1993 | Hansen | 216/63 |
| 5,241,245 | 8/1993 | Barnes et al. | 315/111.41 |
| 5,249,251 | 9/1993 | Egalon et al. | 385/123 |
| 5,258,824 | 11/1993 | Carlson et al. | 356/382 |

| | | | |
|---|---|---|---|
| 5,276,693 | 1/1994 | Long et al. ............................... 372/6 |
| 5,277,751 | 1/1994 | Ogle ....................................... 216/70 |
| 5,326,404 | 7/1994 | Sato ............................. 118/723 MR |
| 5,346,578 | 9/1994 | Benzing et al. ...................... 156/345 |
| 5,349,313 | 9/1994 | Collins et al. ........................ 333/131 |
| 5,392,018 | 2/1995 | Collins et al. ........................ 336/155 |
| 5,399,237 | 3/1995 | Keswick et al. ....................... 216/68 |
| 5,401,350 | 3/1995 | Patrick et al. ........................ 156/345 |
| 5,414,246 | 5/1995 | Shapona ............................... 219/640 |
| 5,423,945 | 6/1995 | Marks et al. .......................... 438/695 |
| 5,477,975 | 12/1995 | Rice et al. .............................. 216/68 |
| 5,514,246 | 5/1996 | Blalock ................................. 438/694 |
| 5,529,657 | 6/1996 | Ishii ...................................... 156/345 |
| 5,556,501 | 9/1996 | Collins et al. ........................ 156/345 |
| 5,693,179 * | 12/1997 | Blackburn et al. .................... 216/67 |
| 5,707,486 * | 1/1998 | Collins ................................. 156/345 |

FOREIGN PATENT DOCUMENTS

| | | |
|---|---|---|
| 0 403 418 A2 | 12/1990 | (EP) . |
| 0 413 282 A2 | 2/1991 | (EP) . |
| 0 520 519 A1 | 6/1992 | (EP) . |
| 0489 407 A2 | 6/1992 | (EP) . |
| 1 520 519 | 12/1992 | (EP) . |
| 0 552 490 A1 | 7/1993 | (EP) . |
| 1 552 491 | 7/1993 | (EP) . |
| 0 601 468 A1 | 6/1994 | (EP) . |
| 0 651 426 A1 | 5/1995 | (EP) . |
| 0 651 434 A2 | 5/1995 | (EP) . |
| 0 680 072 A2 | 11/1995 | (EP) . |
| 0 727 807 A2 | 8/1996 | (EP) . |
| 0 742 577 A2 | 11/1996 | (EP) . |
| 55-154582 | 12/1980 | (JP) . |
| 57-155732 | 9/1982 | (JP) . |
| 61-147531 | 12/1984 | (JP) . |
| 61-91377 | 5/1986 | (JP) . |
| 61-142744 | 6/1986 | (JP) . |
| 62-12129 | 1/1987 | (JP) . |
| 63-9120 | 1/1988 | (JP) . |
| 62-254428 | 11/1997 | (JP) . |
| WO 92/20833 | 11/1992 | (WO) . |

OTHER PUBLICATIONS

Coburn, "Increasing the Etch Ratio of SiO2/Si in Fluorocarbon Plasma Etching", IBM Technical Disclosure Bulleti, vol. 19, No. 10, Mar. 1977.*

Patent Abstracts of Japan, Publication No. 57045927 A, Mar. 16, 1982 (Fujitsu Ltd).

Patent Abstracts of Japan, Publication No. 62052714 A, Mar. 7, 1987 (Olympus Optical Co. Ltd; Toagosei Chem Ind Co Ltd).

Patent Abstracts of Japan, Publication No. 07288196 A, Oct. 31, 1995 (Tokyo Electron Ltd).

Patent Abstracts of Japan, Publication No. 08017799 A, Jan. 19, 1996 (Plasma Syst: KK).

Patent Abstracts of Japan, Publication No. 06196446 A, Jul. 15, 1994 (NEC Corp).

Coburn, W.J. "Increasing the Etch Rate Ratio o$SiO_2$/Si in Fluorocarbon Plasma Etching", IBM Technical Disclosure, vol. 19, No. 10, Mar. 1977.

Matsuo, Seitaro. "Selective etching of $SiO_2$ relative to Si by plasma reactive sputter etching", J. Vac. Sc. Technology, vol. 17, No. 2, Mar.–Apr. 1980.

European Patent Office Communication pursuant to Article 96(2) and Rule 51(2) EPC for Application No. 94307307.2–2208, mailed Jan. 17, 1996.

* cited by examiner

*Primary Examiner*—Rodney G. McDonald
(74) *Attorney, Agent, or Firm*—Michaelson and Wallace

(57) ABSTRACT

The invention is embodied in a method of processing a semiconductor workpiece in a plasma reactor chamber, including supplying a polymer and etchant precursor gas containing at least carbon and fluorine into the chamber at a first flow rate sufficient of itself to maintain a gas pressure in the chamber in a low pressure range below about 20 mT, supplying a relatively non-reactive gas into the chamber at second flow rate sufficient about one half or more of the total gas flow rate into the chamber, in combination with the first flow rate of the precursor gas, to maintain the gas pressure in the chamber in a high pressure range above 20 mT, and applying plasma source power into the chamber to form a high ion density plasma having an ion density in excess of $10^{10}$ ions per cubic centimeter. In one application of the invention, the workpiece includes an oxygen-containing overlayer to be etched by the process and a non-oxygen-containing underlayer to be protected from etching, the precursor gas dissociating in the plasma into fluorine-containing etchant species which etch the oxygen-containing layer and carbon-containing polymer species which accumulate on the non-oxygen-containing underlayer. Alternatively, the high pressure range may be defined as a pressure at which the skin depth of the inductive field exceeds $\frac{1}{10}$ of the gap between the inductive antenna and the workpiece.

24 Claims, 20 Drawing Sheets

HIGH PRESSURE HIGH NON-REACTIVE DILUENT GAS CONTENT HIGH PLASMA ION DENSITY PLASMA OXIDE ETCH PROCESS

RELATED APPLICATIONS

This application is a continuation-in-part of U.S. patent application Ser. No. 08/648,254 filed May. 13, 1996 by Kenneth S. Collins et al entitled "INDUCTIVELY COUPLED RF PLASMA REACTOR HAVING AN OVERHEAD SOLENOIDAL ANTENNA" now U.S. Pat. No. 6,165,311, which is a continuation-in-part of Ser. No. 08/580,026 filed Dec. 20, 1995 pending by Kenneth S. Collins et al. which is a continuation of Ser. No. 08/041,796 filed Apr. 1, 1993 now U.S. Pat. No. 5,556,501 which is a continuation of Ser. No. 07/722,340 filed Jun. 27, 1991 now abandoned; and a continuation-in-part of Ser. No. 08/503,467 filed Jul. 18, 1995 by Michael Rice et al. now U.S. Pat. No. 5,770,099 which is a divisional of Ser. No. 08/138,060 filed Oct. 15, 1993 now U.S. Pat. No. 5,477,975; and a continuation-in-part of Ser. No. 08/597,577 filed Feb. 2, 1996 by Kenneth Collins now U.S. Pat. No. 6,077,384, which is a continuation-in-part of Ser. No. 08/521,668 filed Aug. 31, 1995 (now abandoned), which is a continuation-in-part of Ser. No. 08/289,336 filed Aug. 11, 1994 now abandoned, which is a continuation of Ser. No. 07/984,045 filed Dec. 1, 1992 (now abandoned). In addition, U.S. application Ser. No. 08/648,256 filed May. 13, 1996 by Kenneth S. Collins et al. entitled "Plasma With Heated Source of a Polymer-Hardening Precursor Material" now U.S. Pat. No. 6,036,877 which discloses related subject matter.

BACKGROUND OF THE INVENTION

1. Technical Field

The invention is related to a high pressure high non-reactive diluent gas content high plasma ion density plasma oxide etch process.

2. Background Art

In a plasma processing chamber, and especially in a high density plasma processing chamber, RF (radio frequency) power is used to generate and maintain a plasma within the processing chamber. As disclosed in detail in the aboveref-erenced applications, it is often necessary to control temperatures of surfaces within the process chamber, independent of time varying heat loads imposed by processing conditions, or of other time varying boundary conditions. This is particularly true in the case of a reactor chamber having a window electrode which acts as both a capacitively coupled electrode and a window for admitting therethrough RF power inductively coupled from an inductive antenna. In some cases where the window/electrode is a semiconducting material, it may be necessary to control the temperature of the window/electrode within a particular temperature range to obtain the proper electrical properties of the window. The application of RF power to generate and maintain the plasma leads to heating of surfaces within the chamber, including windows (such as used for inductive or electromagnetic coupling of RF or microwave power) or electrodes (such as used for capacitive or electrostatic coupling of RF power, or for terminating or providing a ground or return path for such capacitive or electrostatic coupling of RF power) or for combination window/electrodes.

In the above-referenced parent application it is disclosed how to overcome the foregoing problems by, among other things, employing multiple solenoid windings at respective radial locations over the reactor chamber ceiling, while enduring the conventional limitations with regard to chamber pressure. As discussed above, the chamber pressure in a high ion density (e.g., $10^{11}$ ions/cc) plasma reactor (e.g., an inductively coupled RF plasma reactor) typically is limited by plasma electron recombination losses that increase with chamber pressure. Such losses prevent electron diffusion that would otherwise enhance plasma ion distribution uniformity. The same is generally true of microwave electron cyclotron resonance plasma reactors. In the case of inductively coupled RF plasma reactors, a typical chamber pressure range is between about 1 mT and 10 mT, while 20 mT is considered above the typical range. Given the definition stated above for "high pressure", in which the inductive field skin depth is greater than 1/10 of the gap between the top electrode and the wafer, 100 mT is definitely "high pressure". The uniformity of etch rate and etch selectivity is reduced as skin depth (or chamber pressure) increases because non-uniformities in the overhead antenna pattern are more strongly mapped to the wafer surface as skin depth increases. For example, it has been demonstrated that reducing chamber pressure from 75 mT to 20 mT greatly enhances etch selectivity uniformity across the wafer. Thus, conventional wisdom has been to limit chamber pressure in a high density plasma reactor.

Such problems are particularly acute in plasma etching of silicon dioxide layers over underlying non-oxygen-containing layers (such as polysilicon, silicon, silicon nitride, and so forth). This is because the silicon-oxygen bond is much stronger than the bonds in the underlying layer, necessitating the passivation of the underlying layer by a polymer deposited from polymer precursor species in the plasma. Without such passivation, the etch selectivity of the silicon dioxide to the underlying non-oxygen containing layer is inadequate. As is well known, the preferred process gases include fluorocarbon or fluoro-hydrocarbon gases because such gases are precursors for both the etchant species (fluorine) and the polymerizing species. Selectivity is enhanced by increasing the chamber pressure (by decreasing the chamber vacuum pump rate or "throttling back" the pump), because such a pressure increase increases the net residence time of the polymer precursor species so that more polymer precursor species are formed in the plasma. (As understood in this specification, the term "residence time" refers to a particular gas species and is the pressure of that gas multiplied by the volume encompassed between the wafer or workpiece and the plasma source power applicator (typically an overhead inductive antenna) divided by the flow rate at which the gas is supplied into the reactor chamber.) Under such conditions, a stronger polymer tends to form on the underlying passivated layers, thereby enhancing etch selectivity.

In order to counteract the stronger polymer formation on the silicon dioxide surfaces to be etched, the ion energy in the plasma must be increased well above the usual level (the silicon-oxygen bond energy) to overcome polymer deposition on the silicon dioxide surfaces. As a result, the process window is decreased to the extent a higher ion energy is required to prevent etch stopping. To avoid such difficulties, it has been desirable to limit the chamber pressure (by increasing the chamber vacuum pump rate), which limits the selectivity which is enhanced by increasing the pressure. Thus, a certain tradeoff exists between etch selectivity and avoidance of etch stopping.

The problem with having to so limit the chamber pressure is that the polymer formation is weakened accordingly. As stated above, the higher chamber pressure produces stronger polymer and, conversely, lower chamber pressure produces weaker polymer passivation layers. The resulting limitation on polymer strength is manifested in photolithographic layers on the wafer, for example, in a phenomenon sometimes referred to as photoresist mask faceting, in which the polymer passivation layer exhibits a certain weakness around the edges of a contact opening in the photoresist mask layer, permitting the plasma to attack the photoresist at those edges or "facets". Typically, the silicon dioxide-to-photoresist selectivity at the facets is about 3:1. The result is that the top of the contact opening widens during the etch process, so that the diameter of the opening cannot be controlled. Such a problem is reduced by increasing the chamber pressure to strengthen the polymer passivation layer over the photoresist, but such an increase in pressure requires a corresponding increase in plasma ion energy to avoid etch stopping near the wafer center, thereby narrowing the process window. Thus, there has seemed to be no real solution to such problems.

It is therefore an object of the present invention to strengthen the polymer passivation layer particularly near photoresist facets without risking etch stopping or requiring an increase in plasma ion energy to prevent such etch stopping or incurring other disadvantages typically associated with an increase in chamber pressure.

SUMMARY OF THE INVENTION

It is a discovery of the present invention that increasing the chamber pressure of a high ion density RF plasma reactor by introducing a non-reactive gas (such as an inert gas), rather than by throttling back the chamber vacuum pump, increases the polymer passivation layer strength, particularly near photoresist facets, without a concomitant increase in risk of etch stopping. Thus, the present invention is embodied in a process in which the etchant and polymer precursor gas, such as a fluorocarbon or fluoro-hydrocarbon gas, is diluted with an inert gas such as argon to increase chamber pressure without a corresponding significant change in the chamber vacuum pump rate. Preferably, the etchant/polymer precursor gas is fed into the chamber at a gas flow rate which, by itself, would maintain the chamber pressure below the high pressure regime, and the non-reactive gas is added at a flow rate which, in combination with the flow rate of the precursor gas, is sufficient to raise the chamber pressure into the high pressure regime. By thus refraining from significantly throttling back the chamber vacuum pump, the polymer precursor residence time in the chamber is not significantly increased. The present invention increases the chamber pressure to increase polymer strength and thereby reduce photoresist faceting without increasing the residence time of the polymer precursor gas in the chamber to avoid etchstopping polymer build-up on the silicon dioxide surfaces. The result is a net increase in the process window, a significant advantage.

In one embodiment of the present invention, the gases supplied to the chamber are as follows: 90 standard cubic centimeters per minute (SCCM) of $CHF_3$ as an etchant/polymer precursor favoring etching, 10 SCCM of $C_4F_8$ as an etchant/polymer precursor favoring polymerization, 16 SCCM of $CO_2$ as an etch stop inhibitor, and 450 SCCM of argon as the non-reactive species added to increase the chamber pressure without decreasing the chamber pump rate. (As employed in this specification, the term "etch stop inhibitor" refers to a class of gases including CO, $CO_2$ and $O_2$ which tend to promote oxidation of polymer materials and whose use ameliorates excessive polymer deposition and thereby reduces or avoids etch stopping.) In general, the flow rate at which the non-reactive (diluent) species gases are supplied into the chamber is some fraction of the total flow rate of all gases supplied to the chamber, depending upon various processing parameters.

Preferably, the process is carried out in the plasma reactor disclosed in the above-referenced parent application because the multiple solenoid coil antenna feature provides the greatest uniformity of plasma ion distribution. However, the same process of generating an inductively coupled high density RF plasma in a carbon-fluorine chemistry at high pressure with a large proportion of nonreactive diluent gas can be carried out in other reactors, such as one with a planar coil antenna over a dielectric ceiling, or one with a single solenoid antenna around a dielectric cylinder or a conformal coil over a dome-shaped ceiling.

The process of the invention may be adjusted by changing the non-reactive diluent gas to a higher or lower atomic weight gas. For example, helium or neon requires more plasma electron energy to ionize than does xenon, so that with xenon a plasma with lower mean electron temperature and higher electron density results, yielding more etch precursor species and providing a higher etch rate. As a result, with xenon the etch rate is very high and there is comparatively lower oxide-to-photoresist etch selectivity. Conversely, with helium or neon the etch rate is lower while the etch selectivity is superior. An ideal balance is achieved with a medium atomic weight inert gas such as argon which provides both a good etch rate and a good etch selectivity.

The process of the invention is also adjusted with the ceiling temperature. For example, in one embodiment of the invention, the ceiling is heated to a high temperature—near the polymer condensation temperature—so that more polymer deposits on the passivated surfaces of the wafer and less on the ceiling. In this case, in order to avoid etch stopping on the oxide surfaces typical at high chamber pressures, dilution of the polymer precursor gases must be increased as the ceiling temperature is increased. The diluent gas content can be (and preferably is) at least 50% or more of the gases in the chamber. Conversely, if the ceiling is cooled well below the polymer condensation temperature, the diluent content may be reduced well below the 50% level.

Other adjustments may be effected to increase or decrease the rate of polymerization by increasing the relative proportion of high carbon-content polymer/etchant precursor gases in the chamber (e.g., $C_4F_8$)—to increase polymerization—or by increasing the relative proportion of high fluorine content polymer/etchant precursor gases (e.g., $CHF_3$)—to increase etch rate. As the proportion of high carbon-content precursor gases is increased, the proportion of non-reactive diluent gas (e.g., argon) and/or etch stop inhibition gases (e.g., $CO_2$) must be increased to avoid etch-stopping on the oxide surfaces.

The invention exhibits a marked increase in etch selectivity of oxide to photoresist, particularly at the photoresist facets, so that there is less faceting (increase in opening size during etching) and therefore greater control over such critical dimensions, a significant advantage.

DETAILED DESCRIPTION OF THE PREFERRED EMBODIMENTS

Disclosure of the Parent Application

Figure 1:
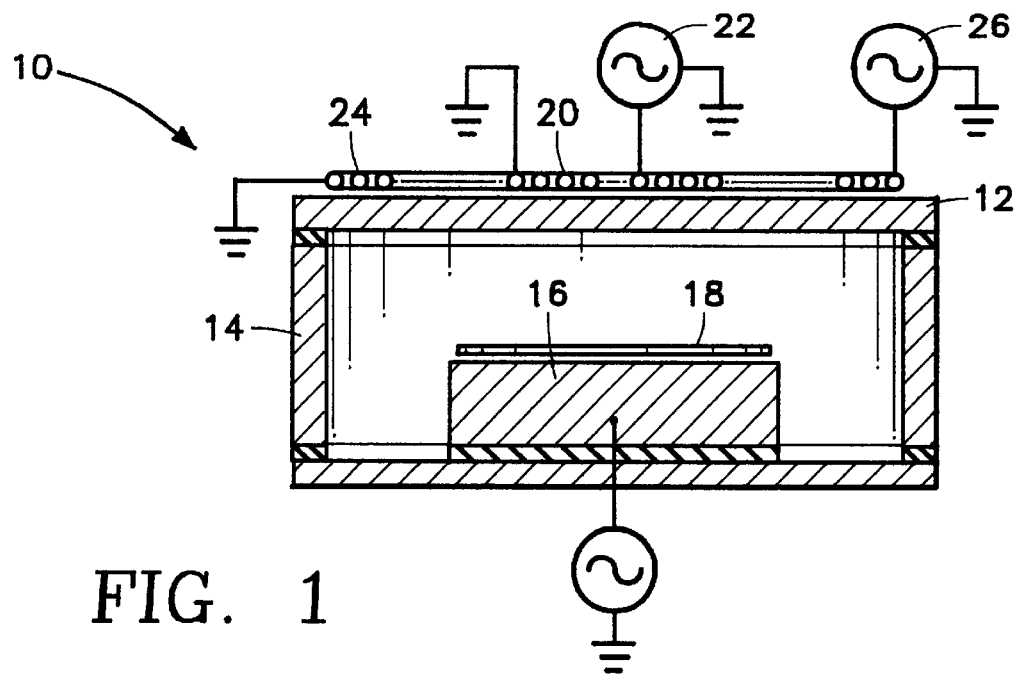
FIG. 1 is a cut-away side view of an inductively coupled plasma reactor of the type employed in a co-pending U.S. patent application referred to above employing generally planar coil antennas.
Figure 2:
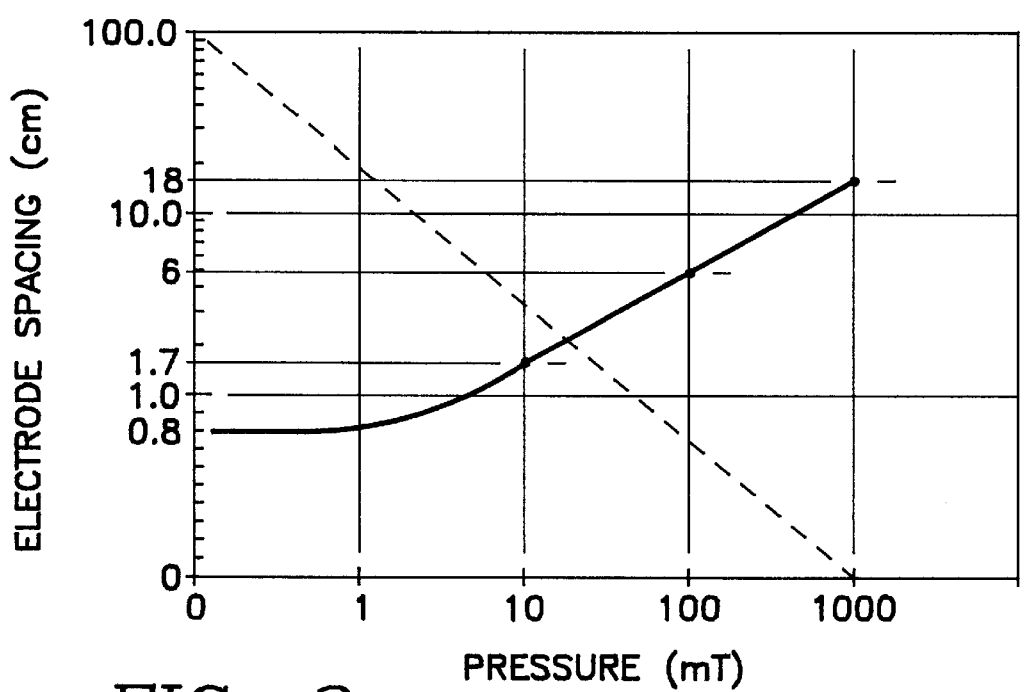
FIG. 2 is a log-log scale graph of induction field skin depth in a plasma in cm (solid line) and of electron-to-neutral elastic collision mean free path length (dashed line) as functions of pressure in torr (horizontal axis).

In a plasma reactor having a small antenna-to-workpiece gap, in order to minimize the decrease in plasma ion density near the center region of the workpiece corresponding to the inductive antenna pattern center null, it is an object of the invention to increase the magnitude of the induced electric field at the center region. The invention accomplishes this by concentrating the turns of an inductive coil overlying the ceiling near the axis of symmetry of the antenna and maximizing the rate of change (at the RF source frequency) of magnetic flux linkage between the antenna and the plasma in that center region.

In accordance with the invention, a solenoidal coil around the symmetry axis simultaneously concentrates its inductive coil turns near the axis and maximizes the rate of change of magnetic flux linkage between the antenna and the plasma in the center region adjacent the workpiece. This is because the number of turns is large and the coil radius is small, as required for strong flux linkage and close mutual coupling to the plasma in the center region. (In contrast, a conventional planar coil antenna spreads its inductive field over a wide radial area, pushing the radial power distribution outward toward the periphery.) As understood in this specification, a solenoid-like antenna is one which has plural inductive elements distributed in a non-planar manner relative to a plane of the workpiece or workpiece support surface or overlying chamber ceiling, or spaced at different distances transversely to the workpiece support plane (defined by a workpiece supporting pedestal within the chamber) or spaced at different distances transversely to an overlying chamber ceiling. As understood in this specification, an inductive element is a current-carrying element mutually coupled with the plasma in the chamber and/or with other inductive elements of the antenna.

A preferred embodiment of the invention includes dual solenoidal coil antennas with one solenoid near the center and another one at an outer peripheral radius. The two solenoids may be driven at different RF frequencies or at the same frequency, in which case they are preferably phase-locked and more preferably phase-locked in such a manner that their fields constructively interact. The greatest practical displacement between the inner and outer solenoid is preferred because it provides the most versatile control of etch rate at the workpiece center relative to etch rate at the workpiece periphery. The skilled worker may readily vary RF power, chamber pressure and electro-negativity of the process gas mixture (by choosing the appropriate ratio of molecular and inert gases) to obtain a wider range or process window in which to optimize (using the present invention) the radial uniformity of the etch rate across the workpiece. Maximum spacing between the separate inner and outer solenoids of the preferred embodiment provides the following advantages:

(1) maximum uniformity control and adjustment;
(2) maximum isolation between the inner and outer solenoids, preventing interference of the field from one solenoid with that of the other; and
(3) maximum space on the ceiling (between the inner and outer solenoids) for temperature control elements to optimize ceiling temperature control.

Figures 4A, 4B:
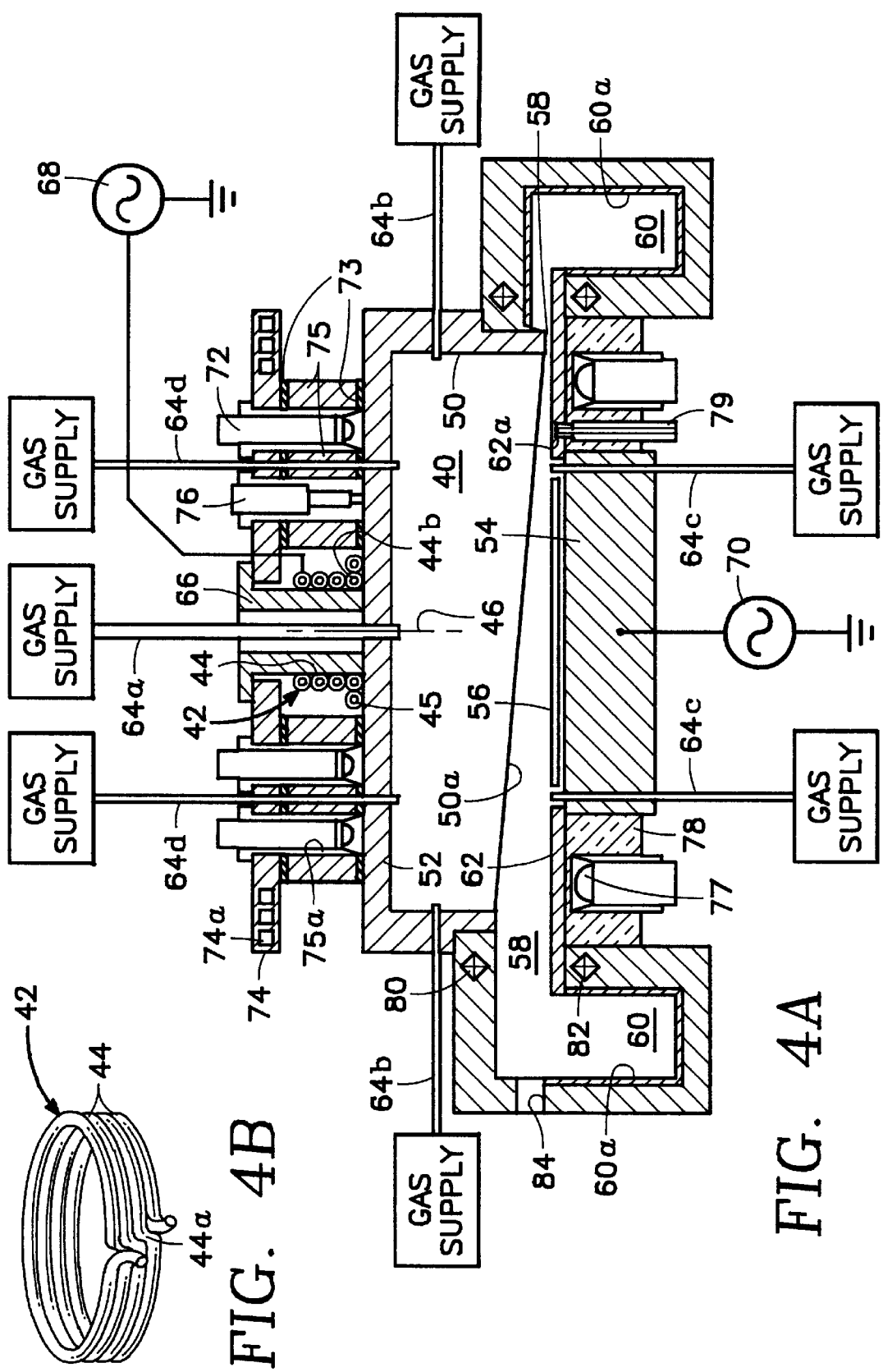
FIG. 4A is a cut-away side view of a plasma reactor employing a single three-dimensional center non-planar solenoid winding.
FIG. 4B is an enlarged view of a portion of the reactor of FIG. 4A illustrating a preferred way of winding the solenoidal winding.

FIG. 4A illustrates a single solenoid embodiment (not the preferred embodiment) of an inductively coupled RF plasma reactor having a short workpiece-to-ceiling gap, meaning that the skin depth of the induction field is on the order of the gap length. As understood in this specification, a skin depth which is on the order of the gap length is that which is within a factor of ten of (i.e., between about one tenth and about ten times) the gap length.

Figure 3A:
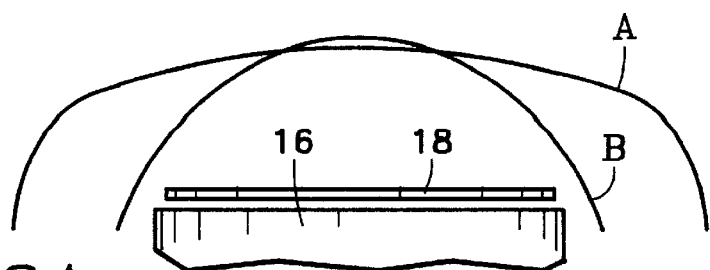
FIG. 3A is a graph of plasma ion density as a function of radial position relative to the workpiece center in the reactor of FIG. 1 for a workpiece-to-ceiling height of 4 inches, the curves labelled A and B corresponding to plasma ion densities produced by outer and inner coil antennas respectively.
Figure 3B:
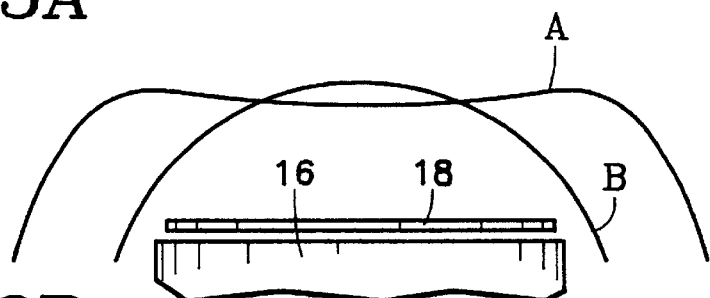
FIG. 3B is a graph of plasma ion density as a function of radial position relative to the workpiece center in the reactor of FIG. 1 for a workpiece-to-ceiling height of 3 inches, the curves labelled A and B corresponding to plasma ion densities produced by outer and inner coil antennas respectively.
Figure 3C:
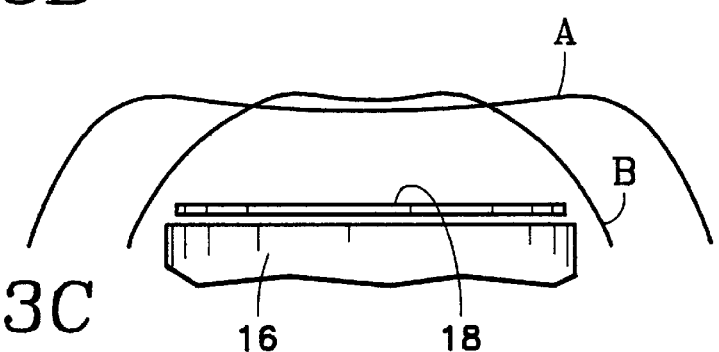
FIG. 3C is a graph of plasma ion density as a function of radial position relative to the workpiece center in the reactor of FIG. 1 for a workpiece-to-ceiling height of 2.5 inches, the curves labelled A and B corresponding to plasma ion densities produced by outer and inner coil antennas respectively.
Figure 3D:
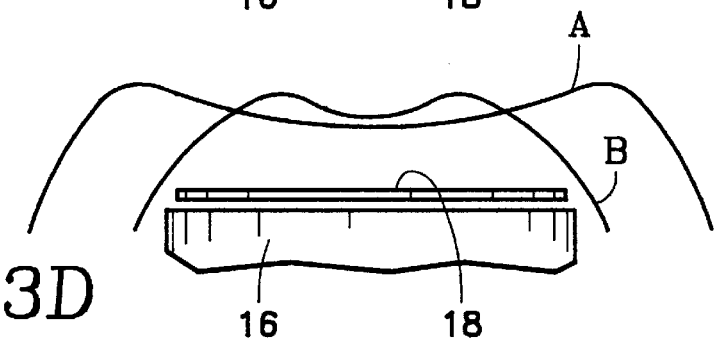
FIG. 3D is a graph of plasma ion density as a function of radial position relative to the workpiece center in the reactor of FIG. 1 for a workpiece-to-ceiling height of 1.25 inches, the curves labelled A and B corresponding to plasma ion densities produced by outer and inner coil antennas respectively.
Figure 3E:
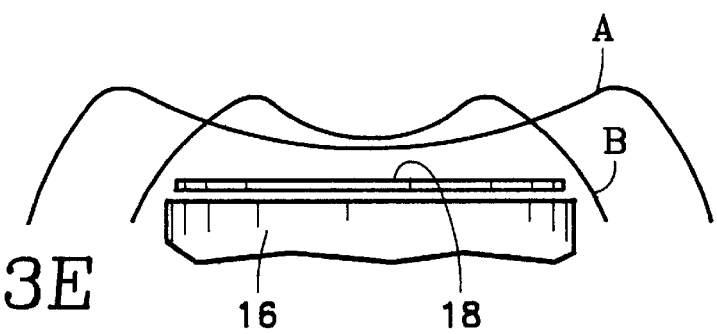
FIG. 3E is a graph of plasma ion density as a function of radial position relative to the workpiece center in the reactor of FIG. 1 for a workpiece-to-ceiling height of 0.8 inches, the curves labelled A and B corresponding to plasma ion densities produced by outer and inner coil antennas respectively.
Figure 5:
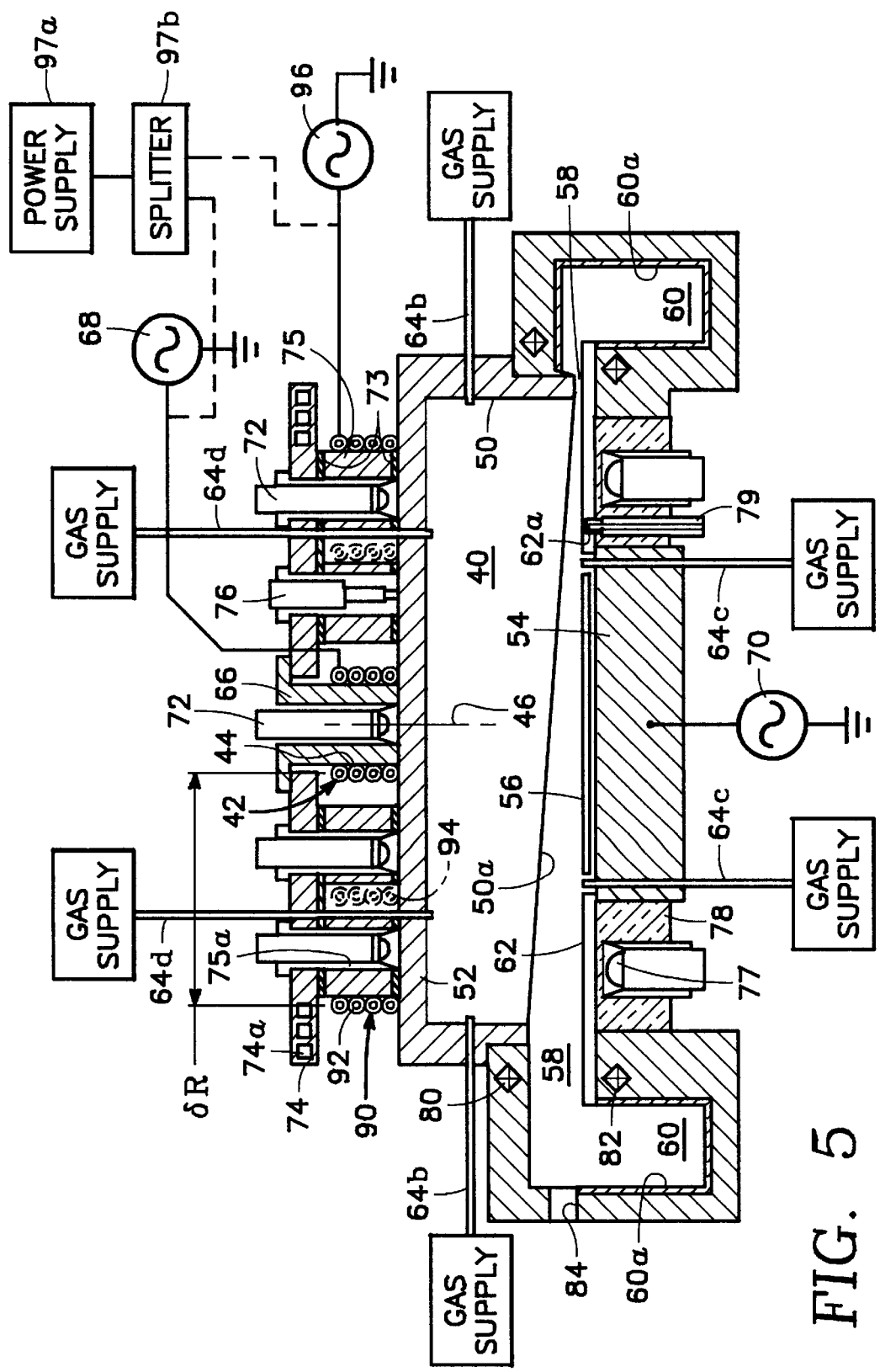
FIG. 5 is a cut-away side view of a plasma reactor employing inner and outer vertical solenoid windings.

FIG. 5 illustrates a dual solenoid embodiment of an inductively coupled RF plasma reactor, and is the preferred embodiment of the invention. Except for the dual solenoid feature, the reactor structure of the embodiments of FIGS. 4A and 5 is nearly the same, and will now be described with reference to FIG. 4A. The reactor includes a cylindrical chamber 40 similar to that of FIG. 1, except that the reactor of FIG. 4A has a non-planar coil antenna 42 whose windings 44 are closely concentrated in non-planar fashion near the antenna symmetry axis 46. While in the illustrated embodiment the windings 44 are symmetrical and their symmetry axis 46 coincides with the center axis of the chamber, the invention may be carried out differently. For example, the windings may not be symmetrical and/or their axis of symmetry may not coincide. However, in the case of a symmetrical antenna, the antenna has a radiation pattern null near its symmetry axis 46 coinciding with the center of the chamber or the workpiece center. Close concentration of the windings 44 about the center axis 46 compensates for this null and is accomplished by vertically stacking the windings 44 in the manner of a solenoid so that they are each a minimum distance from the chamber center axis 46. This increases the product of current (I) and coil turns (N) near the chamber center axis 46 where the plasma ion density has been the weakest for short workpiece-to-ceiling heights, as discussed above with reference to FIGS. 3D and 3E. As a result, the RF power applied to the non-planar coil antenna 42 produces greater induction [d/dt] [N·I] at the wafer center—at the antenna symmetry axis 46—(relative to the peripheral regions) and therefore produces greater plasma ion density in that region, so that the resulting plasma ion density is more nearly uniform despite the small workpiece-to-ceiling height. Thus, the invention provides a way for reducing the ceiling height for enhanced plasma process performance without sacrificing process uniformity.

The drawing of FIG. 4B best shows a preferred implementation of the windings employed in the embodiments of FIGS. 4A and 5. In order that the windings 44 be at least nearly parallel to the plane of the workpiece 56, they preferably are not wound in the usual manner of a helix but, instead, are preferably wound so that each individual turn is parallel to the (horizontal) plane of the workpiece 56 except at a step or transition 44a between turns (from one horizontal plane to the next).

Figure 4C:
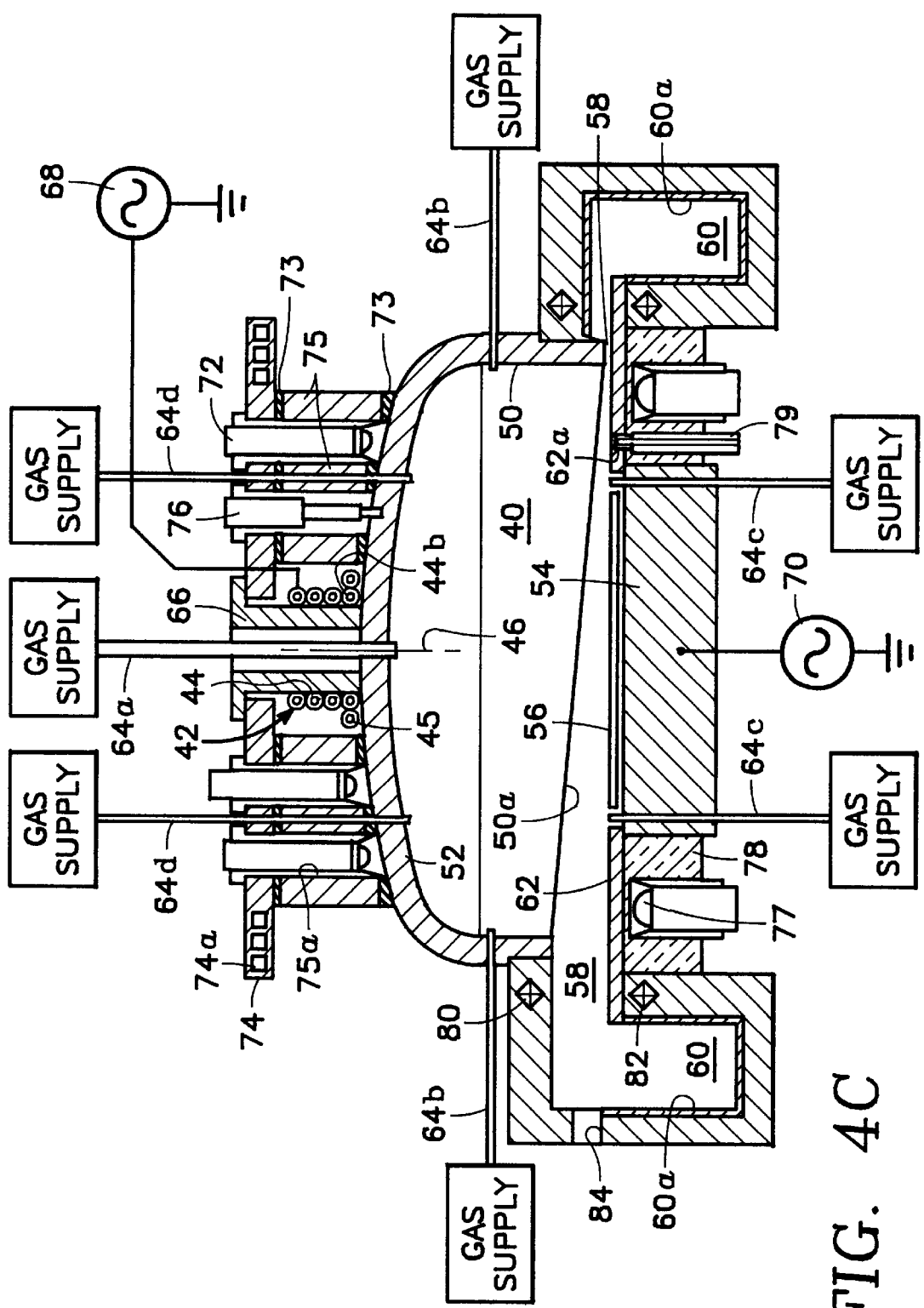
FIG. 4C is a cut-away side view of a plasma reactor corresponding to FIG. 4A but having a dome-shaped ceiling.
Figure 4D:
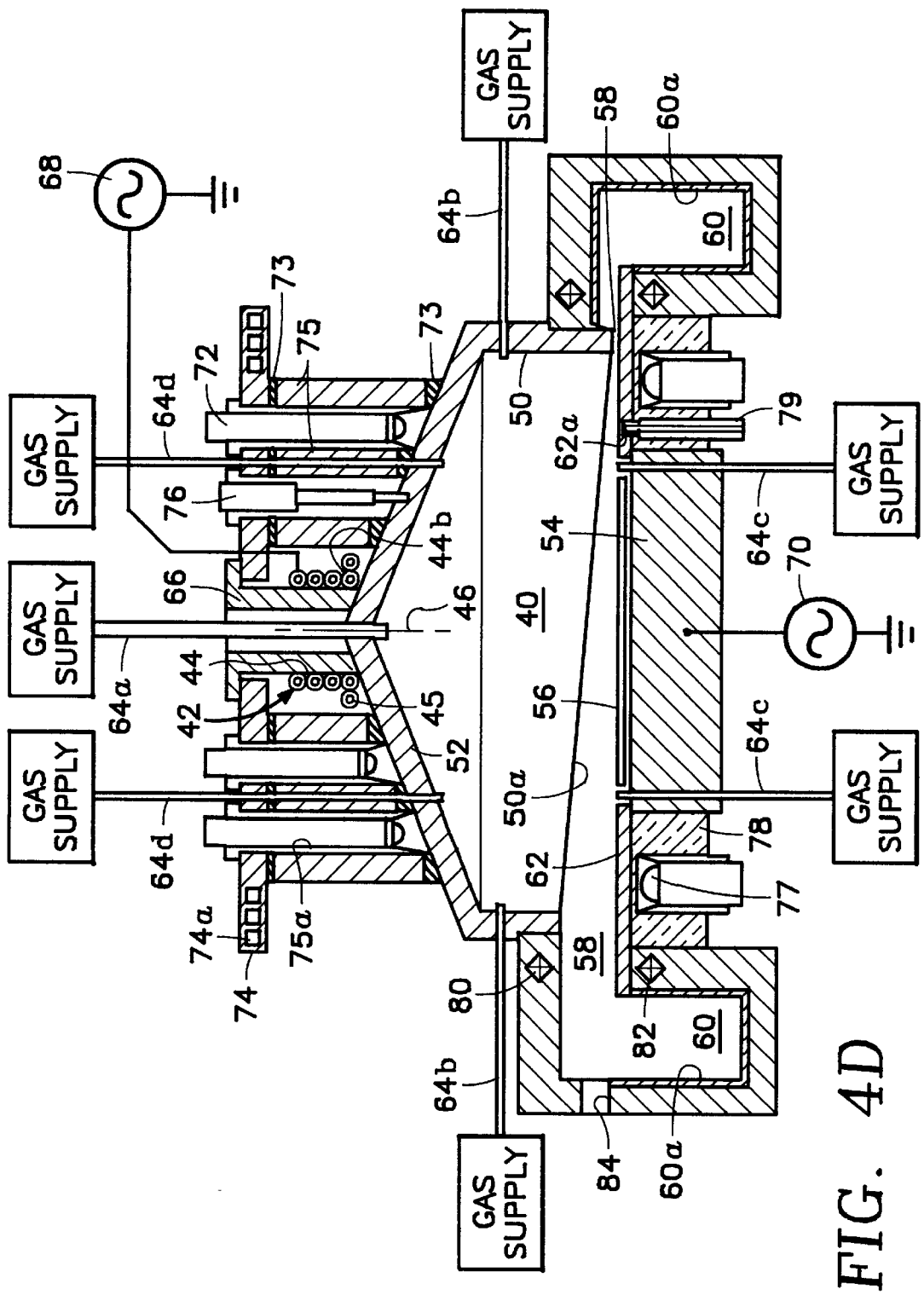
FIG. 4D is a cut-away side view of a plasma reactor corresponding to FIG. 4A but having a conical ceiling.
Figure 4E:
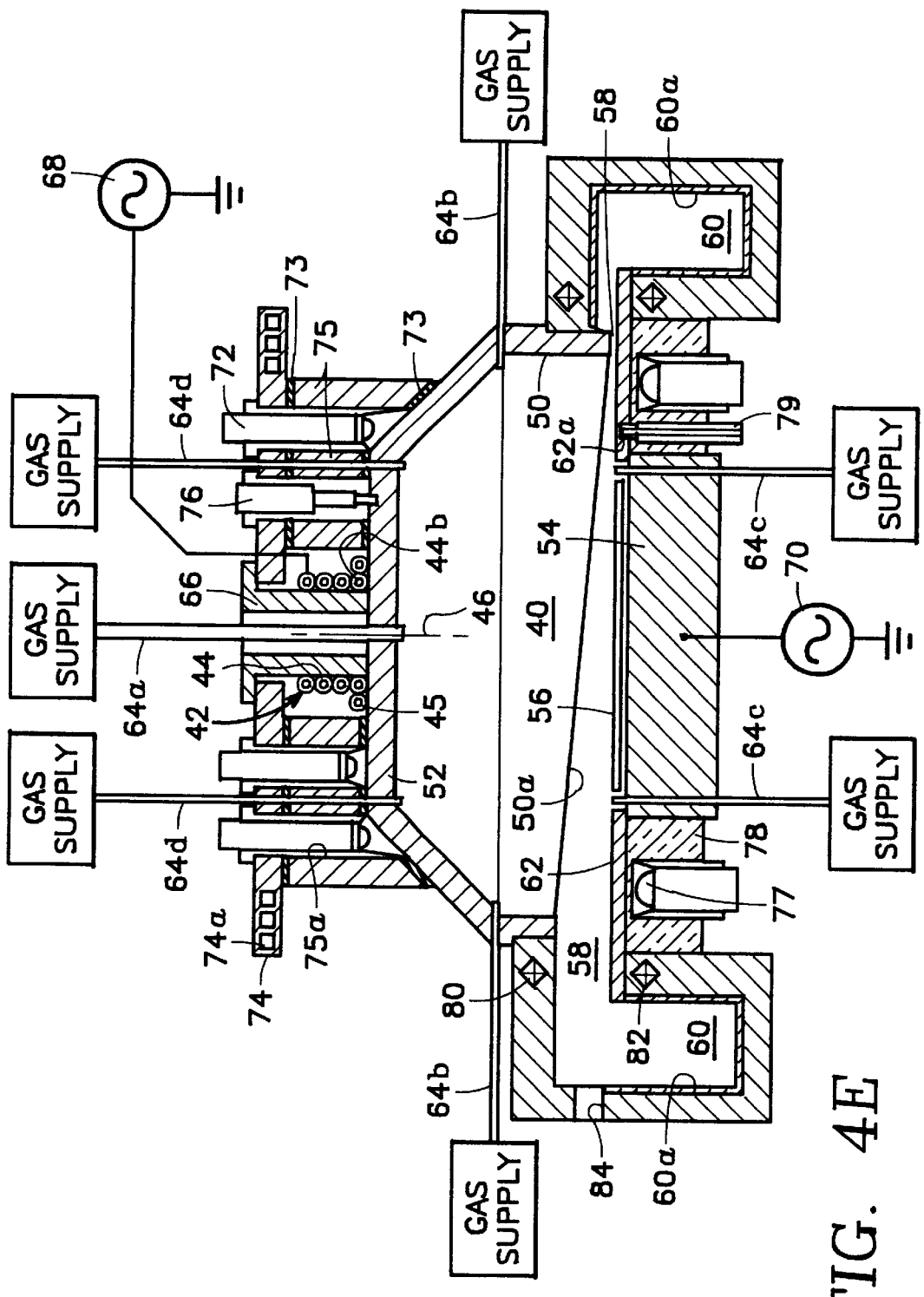
FIG. 4E is a cut-away side view of a plasma reactor corresponding to FIG. 4D but having a truncated conical ceiling.

The cylindrical chamber 40 consists of a cylindrical side wall 50 and a circular ceiling 52 integrally formed with the side wall 50 so that the side wall 50 and ceiling 52 constitute a single piece of material, such as silicon. However, the invention may be carried out with the side wall 50 and ceiling 52 formed as separate pieces, as will be described later in this specification. The circular ceiling 52 may be of any suitable cross-sectional shape such as planar (FIG. 4A), dome (FIG. 4C), conical (FIG. 4D), truncated conical (FIG. 4E), cylindrical or any combination of such shapes or curve of rotation. Such a combination will be discussed later in this specification. Generally, the vertical pitch of the solenoid 42 (i.e., its vertical height divided by its horizontal width) exceeds the vertical pitch of the ceiling 52, even for ceilings defining 3-dimensional surfaces such as dome, conical, truncated conical and so forth. The purpose for this, at least in the preferred embodiment, is to concentrate the induction of the antenna near the antenna symmetry axis, as discussed previously in this specification. A solenoid having a pitch exceeding that of the ceiling is referred to herein as a non-conformal solenoid, meaning that, in general, its shape does not conform with the shape of the ceiling, and more specifically that its vertical pitch exceeds the vertical pitch of the ceiling. A 2-dimensional or flat ceiling has a vertical pitch of zero, while a 3-dimensional ceiling has a non-zero vertical pitch.

A pedestal 54 at the bottom of the chamber 40 supports a planar workpiece 56 in a workpiece support plane during processing. The workpiece 56 is typically a semiconductor wafer and the workpiece support plane is generally the plane of the wafer or workpiece 56. The chamber 40 is evacuated by a pump (not shown in the drawing) through an annular passage 58 to a pumping annulus 60 surrounding the lower portion of the chamber 40. The interior of the pumping annulus may be lined with a replaceable metal liner 60a. The annular passage 58 is defined by the bottom edge 50a of the cylindrical side wall 50 and a planar ring 62 surrounding the pedestal 54. Process gas is furnished into the chamber 40 through any one or all of a variety of gas feeds. In order to control process gas flow near the workpiece center, a center gas feed 64a can extend downwardly through the center of the ceiling 52 toward the center of the workpiece 56 (or the center of the workpiece support plane). In order to control gas flow near the workpiece periphery (or near the periphery of the workpiece support plane), plural radial gas feeds 64b, which can be controlled independently of the center gas feed 64a, extend radially inwardly from the side wall 50 toward the workpiece periphery (or toward the workpiece support plane periphery), or base axial gas feeds 64c extend upwardly from near the pedestal 54 toward the workpiece periphery, or ceiling axial gas feeds 64d can extend downwardly from the ceiling 52 toward the workpiece periphery. Etch rates at the workpiece center and periphery can be adjusted independently relative to one another to achieve a more radially uniform etch rate distribution across the workpiece by controlling the process gas flow rates toward the workpiece center and periphery through, respectively, the center gas feed 64a and any one of the outer gas feeds 64b–d. This feature of the invention can be carried out with the center gas feed 64a and only one of the peripheral gas feeds 64b–d.

The solenoidal coil antenna 42 is wound around a housing 66 surrounding the center gas feed 64. A plasma source RF power supply 68 is connected across the coil antenna 42 and a bias RF power supply 70 is connected to the pedestal 54.

Confinement of the overhead coil antenna 42 to the center region of the ceiling 52 leaves a large portion of the top surface of the ceiling 52 unoccupied and therefore available for direct contact with temperature control apparatus including, for example, plural radiant heaters 72 such as tungsten halogen lamps and a water-cooled cold plate 74 which may be formed of copper or aluminum for example, with coolant passages 74a extending therethrough. Preferably the coolant passages 74a contain a coolant of a known variety having a high thermal conductivity but a low electrical conductivity, to avoid electrically loading down the antenna or solenoid 42. The cold plate 74 provides constant cooling of the ceiling 52 while the maximum power of the radiant heaters 72 is selected so as to be able to overwhelm, if necessary, the cooling by the cold plate 74, facilitating responsive and stable temperature control of the ceiling 52. The large ceiling area irradiated by the heaters 72 provides greater uniformity and efficiency of temperature control. (It should be noted that radiant heating is not necessarily required in carrying out the invention, and the skilled worker may choose to employ an electric heating element instead, as will be described later in this specification.) If the ceiling 52 is silicon, as disclosed in co-pending U.S. application Ser. No. 08/597,577 filed Feb. 2, 1996 by Kenneth S. Collins et al., then there is a significant advantage to be gained by thus increasing the uniformity and efficiency of the temperature control across the ceiling. Specifically, where a polymer precursor and etchant precursor process gas (e.g., a fluorocarbon gas) is employed and where the etchant (e.g., fluorine) must be scavenged, the rate of polymer deposition across the entire ceiling 52 and/or the rate at which the ceiling 52 furnishes a fluorine etchant scavenger material (silicon) into the plasma is better controlled by increasing the contact area of the ceiling 52 with the temperature control heater 72. The solenoid antenna 42 increases the available contact area on the ceiling 52 because the solenoid windings 44 are concentrated at the center axis of the ceiling 52.

The increase in available area on the ceiling 52 for thermal contact is exploited in a preferred implementation by a highly thermally conductive torus 75 (formed of a ceramic such as aluminum nitride, aluminum oxide or silicon nitride or of a non-ceramic like silicon or silicon carbide either lightly doped or undoped) whose bottom surface rests on the ceiling 52 and whose top surface supports the cold plate 74. One feature of the torus 75 is that it displaces the cold plate 74 well-above the top of the solenoid 42. This feature substantially mitigates or nearly eliminates the reduction in inductive coupling between the solenoid 42 and the plasma which would otherwise result from a close proximity of the conductive plane of the cold plate 74 to the solenoid 42. In order to prevent such a reduction in inductive coupling, it is preferable that the distance between the cold plate 74 and the top winding of the solenoid 42 be at least a substantial fraction (e.g., one half) of the total height of the solenoid 42. Plural axial holes 75a extending through the torus 75 are spaced along two concentric circles and hold the plural radiant heaters or lamps 72 and permit them to directly irradiate the ceiling 52. For greatest lamp efficiency, the hole interior surface may be lined with a reflective (e.g., aluminum) layer. The center gas feed 64a of FIG. 4 may be replaced by a radiant heater 72 (as shown in FIG. 5), depending upon the particular reactor design and process conditions. The ceiling temperature is sensed by a sensor such as a thermocouple 76 extending through one of the holes 75a not occupied by a lamp heater 72. For good thermal contact, a highly thermally conductive elastomer 73 such as silicone rubber impregnated with boron nitride is placed between the ceramic torus 75 and the copper cold plate 74 and between the ceramic torus 75 and the silicon ceiling 52.

As disclosed in the above-referenced co-pending application, the chamber 40 may be an all-semiconductor chamber, in which case the ceiling 52 and the side wall 50 are both a semiconductor material such as silicon or silicon carbide. As described in the above-referenced co-pending application, controlling the temperature of, and RF bias power applied to, either the ceiling 52 or the wall 50 regulates the extent to which it furnishes fluorine scavenger precursor material (silicon) into the plasma or, alternatively, the extent to which it is coated with polymer. The material of the ceiling 52 is not limited to silicon but may be, in the alternative, silicon carbide, silicon dioxide (quartz), silicon nitride or a ceramic.

As described in the above-referenced co-pending application, the chamber wall or ceiling 50, 52 need not be used as the source of a fluorine scavenger material. Instead, a disposable silicon member can be placed inside the chamber 40 and maintained at a sufficiently high temperature to prevent polymer condensation thereon and permit silicon material to be removed therefrom into the plasma as fluorine scavenging material. In this case, the wall 50 and ceiling 52 need not necessarily be silicon, or if they are silicon, they (or the disposable silicon member) may be maintained at a temperature (and/or RF bias) near or below the polymer condensation temperature (and/or a polymer condensation RF bias threshold) so that they are coated with polymer from the plasma so as to be protected from being consumed. While the disposable silicon member may take any appropriate form, in the embodiment of FIG. 4 the disposable silicon member is an annular ring 62 surrounding the pedestal 54. Preferably, the annular ring 62 is high purity silicon and may be doped to alter its electrical or optical properties. In order to maintain the silicon ring 62 at a sufficient temperature to ensure its favorable participation in the plasma process (e.g., its contribution of silicon material into the plasma for fluorine scavenging), plural radiant (e.g., tungsten halogen lamp) heaters 77 arranged in a circle under the annular ring 62 heat the silicon ring 62 through a quartz window 78. As described in the abovereferenced co-pending application, the heaters 77 are controlled in accordance with the measured temperature of the silicon ring 62 sensed by a temperature sensor 79 which may be a remote sensor such as an optical pyrometer or a fluoro-optical probe. The sensor 79 may extend partially into a very deep hole 62a in the ring 62, the deepness and narrowness of the hole tending at least partially to mask temperature-dependent variations in thermal emissivity of the silicon ring 62, so that it behaves more like a gray-body radiator for more reliable temperature measurement.

As described in U.S. application Ser. No. 08/597,577 referred to above, an advantage of an all-semiconductor chamber is that the plasma is free of contact with contaminant producing materials such as metal, for example. For this purpose, plasma confinement magnets 80, 82 adjacent the annular opening 58 prevent or reduce plasma flow into the pumping annulus 60. To the extent any polymer precursor and/or active species succeeds in entering the pumping annulus 60, any resulting polymer or contaminant deposits on the replaceable interior liner 60a may be prevented from re-entering the plasma chamber 40 by maintaining the liner 60a at a temperature significantly below the polymer condensation temperature, for example, as disclosed in the referenced co-pending application.

A wafer slit valve 84 through the exterior wall of the pumping annulus 60 accommodates wafer ingress and egress. The annular opening 58 between the chamber 40 and pumping annulus 60 is larger adjacent the wafer slit valve 84 and smallest on the opposite side by virtue of a slant of the bottom edge of the cylindrical side wall 50 so as to make the chamber pressure distribution more symmetrical with a non-symmetrical pump port location.

Maximum inductance near the chamber center axis 46 is achieved by the vertically stacked solenoidal windings 44. In the embodiment of FIG. 4, another winding 45 outside of the vertical stack of windings 44 but in the horizontal plane of the bottom solenoidal winding 44a may be added, provided the additional winding 45 is close to the bottom solenoidal winding 44a.

Referring specifically now to the preferred dual solenoid embodiment of FIG. 5, a second outer vertical stack or solenoid 120 of windings 122 at an outer location (i.e, against the outer circumferential surface of the thermally conductive torus 75) is displaced by a radial distance δR from the inner vertical stack of solenoidal windings 44. Note that in FIG. 5 confinement of the inner solenoidal antenna 42 to the center and the outer solenoidal antenna 120 to the periphery leaves a large portion of the top surface of the ceiling 52 available for direct contact with the temperature control apparatus 72, 74, 75, as in FIG. 4A. An advantage is that the larger surface area contact between the ceiling 52 and the temperature control apparatus provides a more efficient and more uniform temperature control of the ceiling 52.

For a reactor in which the side wall and ceiling are formed of a single piece of silicon for example with an inside diameter of 12.6 in (32 cm), the wafer-to-ceiling gap is 3 in (7.5 cm), and the mean diameter of the inner solenoid was 3.75 in (9.3 cm) while the mean diameter of the outer solenoid was 10.0 in (25.4 cm) using 3/16 in diameter hollow copper tubing covered with a 0.03 thick teflon insulation layer, each solenoid consisting of four turns and being 1 in (2.54 cm) high. The outer stack or solenoid 120 is energized by a second independently controllable plasma source RF power supply 96. The purpose is to permit different user-selectable plasma source power levels to be applied at different radial locations relative to the workpiece or wafer 56 to permit compensation for known processing non-uniformities across the wafer surface, a significant advantage. In combination with the independently controllable center gas feed 64a and peripheral gas feeds 64b–d, etch performance at the workpiece center may be adjusted relative to etch performance at the edge by adjusting the RF power applied to the inner solenoid 42 relative to that applied to the outer solenoid 90 and adjusting the gas flow rate through the center gas feed 64a relative to the flow rate through the outer gas feeds 64b–d. While the present invention solves or at least ameliorates the problem of a center null or dip in the inductance field as described above, there may be other plasma processing non-uniformity problems, and these can be compensated in the versatile embodiment of FIG. 5 by adjusting the relative RF power levels applied to the inner and outer antennas. For effecting this purpose with greater convenience, the respective RF power supplies 68, 96 for the inner and outer solenoids 42, 90 may be replaced by a common power supply 97a and a power splitter 97b which permits the user to change the relative apportionment of power between the inner and outer solenoids 42, 90 while preserving a fixed phase relationship between the fields of the inner and outer solenoids 42, 90. This is particularly important where the two solenoids 42, 90 receive RF power at the same frequency. Otherwise, if the two independent power supplies 68, 96 are employed, then they may be powered at different RF frequencies, in which case it is preferable to install RF filters at the output of each RF power supply 68, 96 to avoid off-frequency feedback from coupling between the two solenoids. In this case, the frequency difference should be sufficient to time-average out coupling between the two solenoids and, furthermore, should exceed the rejection bandwidth of the RF filters. The preferred option is to make each frequency independently resonantly matched to the respective solenoid, and each frequency may be varied to follow changes in the plasma impedance (thereby maintaining resonance) in lieu of conventional impedance matching techniques. In other words, the RF frequency applied to the antenna if made to follow the resonant frequency of the antenna as loaded by the impedance of the plasma in the chamber. In such implementations, the frequency ranges of the two solenoids should be mutually exclusive. Alternately, the two solenoids may be driven at the same RF frequency and in this case it is preferable that the phase relationship between the two be such as to cause constructive interaction or superposition of the fields of the two solenoids. Generally, this requirement will be met by a zero phase angle between the signals applied to the two solenoids if they are both wound in the same sense. Otherwise, if they are oppositely wound, the phase angle is preferably 180°. In any case, coupling between the inner and outer solenoids can be minimized or eliminated by having a relatively large space between the inner and outer solenoids 42, 90, as will be discussed below in this specification.

The range attainable by such adjustments is increased by increasing the radius of the outer solenoid 90 to increase the spacing between the inner and outer solenoids 42, 90, so that the effects of the two solenoids 42, 90 are more confined to the workpiece center and edge, respectively. This permits a greater range of control in superimposing the effects of the two solenoids 42, 90. For example, the radius of the inner solenoid 42 should be no greater than about half the workpiece radius and preferably no more than about a third thereof. (The minimum radius of the inner solenoid 42 is affected in part by the diameter of the conductor forming the solenoid 42 and in part by the need to provide a finite non-zero circumference for an arcuate—e.g., circular—current path to produce inductance.) The radius of the outer coil 90 should be at least equal to the workpiece radius and preferably 1.2 or more times the workpiece radius. With such a configuration, the respective center and edge effects of the inner and outer solenoids 42, 90 are so pronounced that by increasing power to the inner solenoid the chamber pressure can be raised into the hundreds of mT while providing a uniform plasma, and by increasing power to the outer solenoid 90 the chamber pressure can be reduced to on the order of 0.01 mT while providing a uniform plasma. Another advantage of such a large radius of the outer solenoid 90 is that it minimizes coupling between the inner and outer solenoids 42, 90.

FIG. 5 indicates in dashed line that a third solenoid may be added as an option, which is desirable for a very large chamber diameter.

Figure 6:
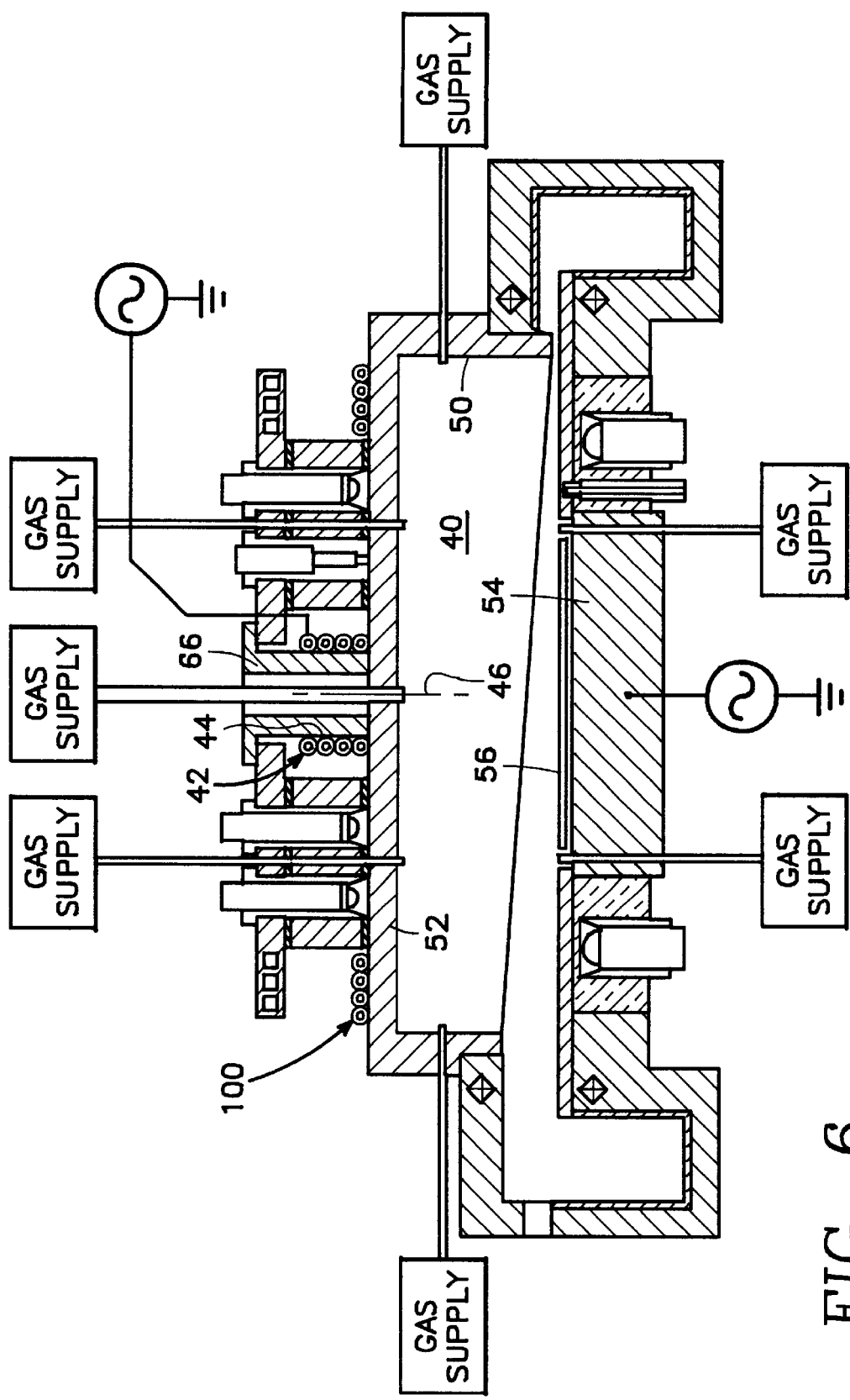
FIG. 6 is a cut-away side view of a plasma reactor corresponding to FIG. 5 in which the outer winding is flat.

FIG. 6 illustrates a variation of the embodiment of FIG. 5 in which the outer solenoid 90 is replaced by a planar winding 100.

Figure 7:
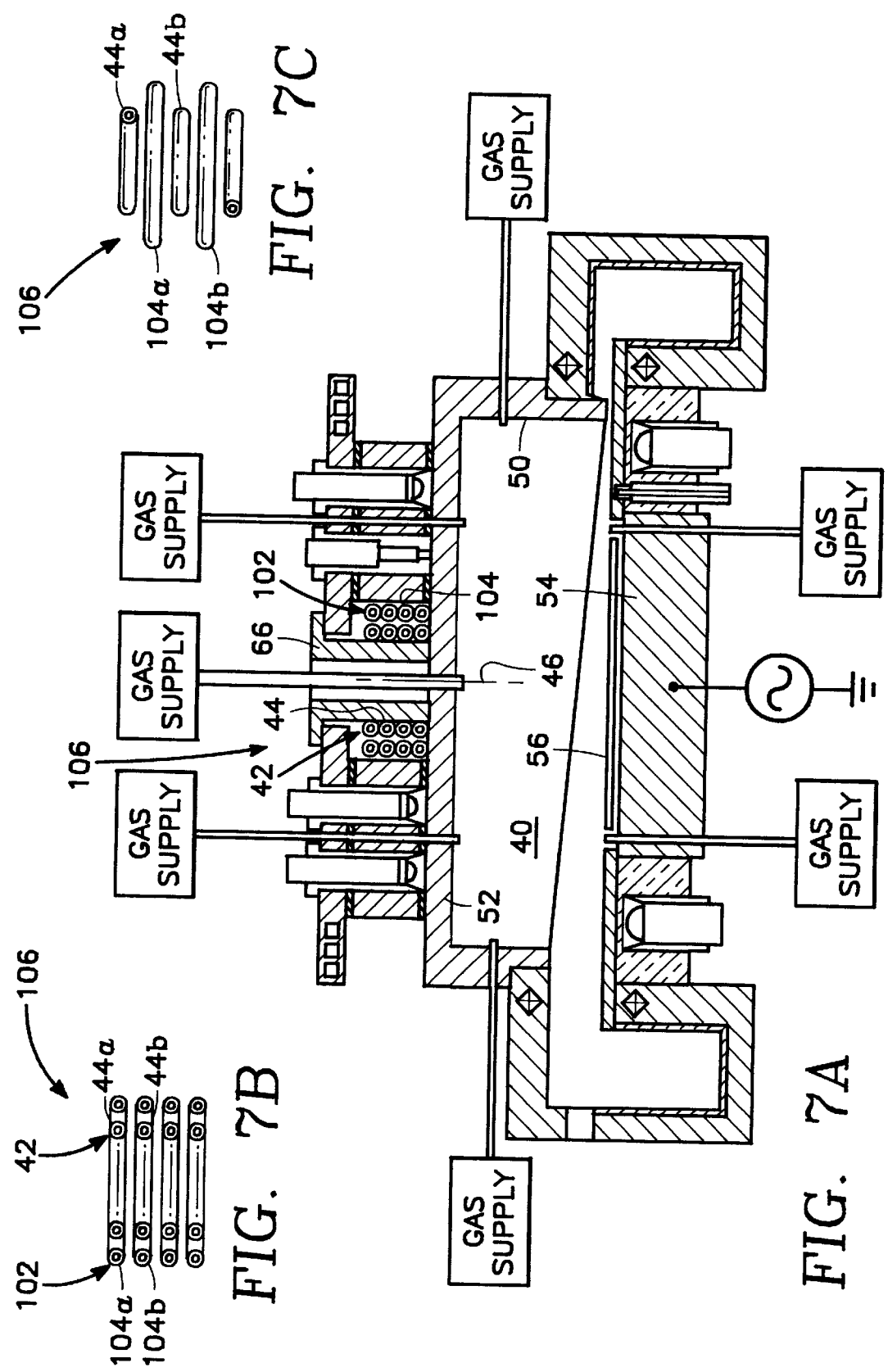
FIG. 7A is a cut-away side view of a plasma reactor corresponding to FIG. 4 in which the center solenoid winding consists of plural upright cylindrical windings.
FIG. 7B is a detailed view of a first implementation of the embodiment of FIG. 7A.
FIG. 7C is a detailed view of a second implementation of the embodiment of FIG. 7A.

FIG. 7A illustrates a variation of the embodiment of FIG. 4 in which the center solenoidal winding includes not only the vertical stack 42 of windings 44 but in addition a second vertical stack 102 of windings 104 closely adjacent to the first stack 42 so that the two stacks constitute a double-wound solenoid 106. Referring to FIG. 7B, the doubly wound solenoid 106 may consist of two independently wound single solenoids 42, 102, the inner solenoid 42 consisting of the windings 44a, 44b, and so forth and the outer solenoid 102 consisting of the winding 104a, 104b and so forth. Alternatively, referring to FIG. 7C, the doubly wound solenoid 106 may consist of vertically stacked pairs of at least nearly co-planar windings. In the alternative of FIG. 7C, each pair of nearly co-planar windings (e.g., the pair 44a, 104a or the pair 44b, 104b) may be formed by helically winding a single conductor. The term "doubly wound" used herein refers to winding of the type shown in either FIG. 7B or 7C. In addition, the solenoid winding may not be merely doubly wound but may be triply wound or more and in general it can consists of plural windings at each plane along the axis of symmetry. Such multiple-wound solenoids may be employed in either one or both the inner and outer solenoids 42, 90 of the dual-solenoid embodiment of FIG. 5.

Figure 8:
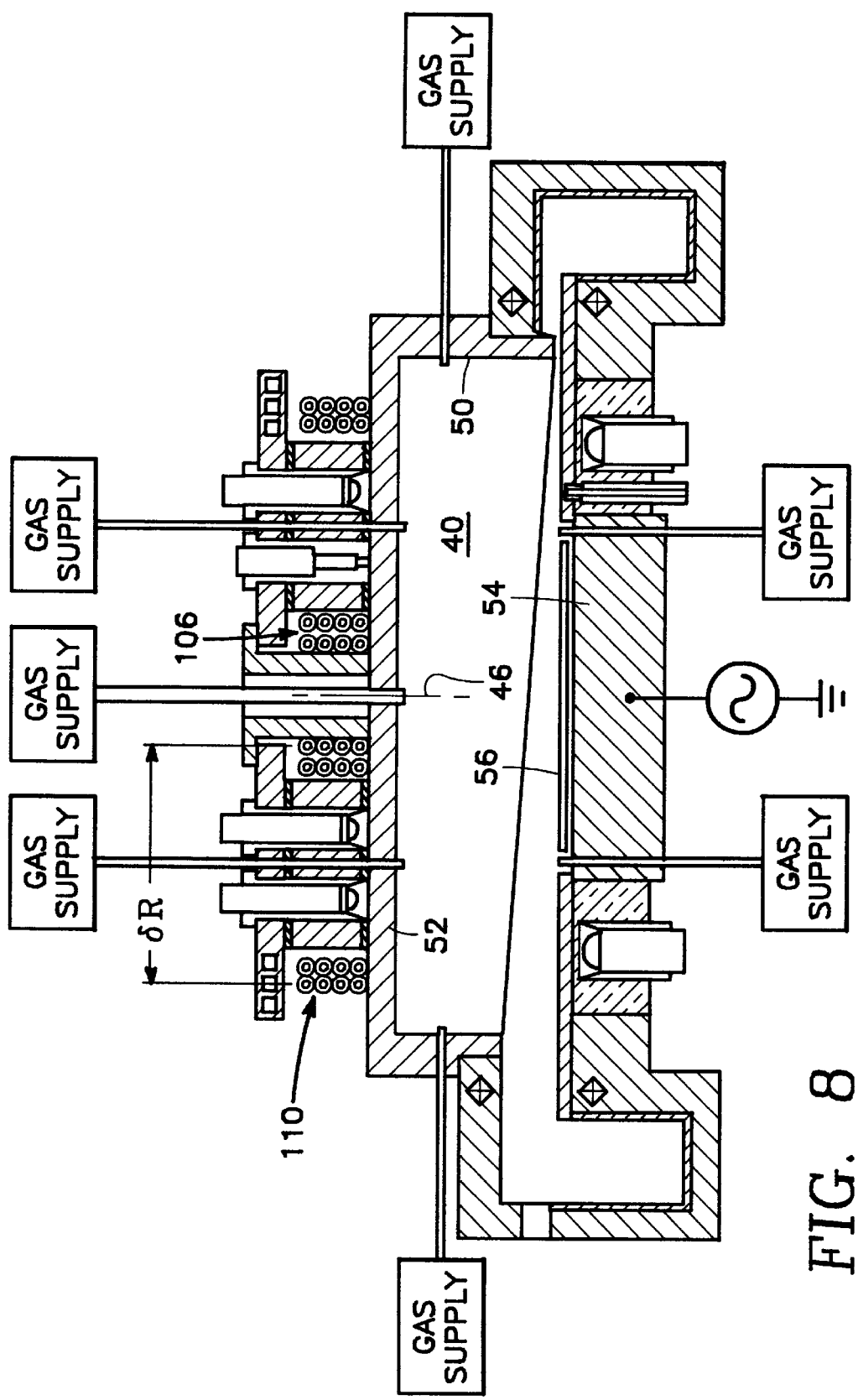
FIG. 8 is a cut-away side view of a plasma reactor corresponding to FIG. 5 in which both the inner and outer windings consist of plural upright cylindrical windings.

FIG. 8 illustrates a variation of the embodiment of FIG. 7A in which an outer doubly wound solenoid 110 concentric with the inner doubly wound solenoid 106 is placed at a radial distance δR from the inner solenoid 106.

Figure 9:
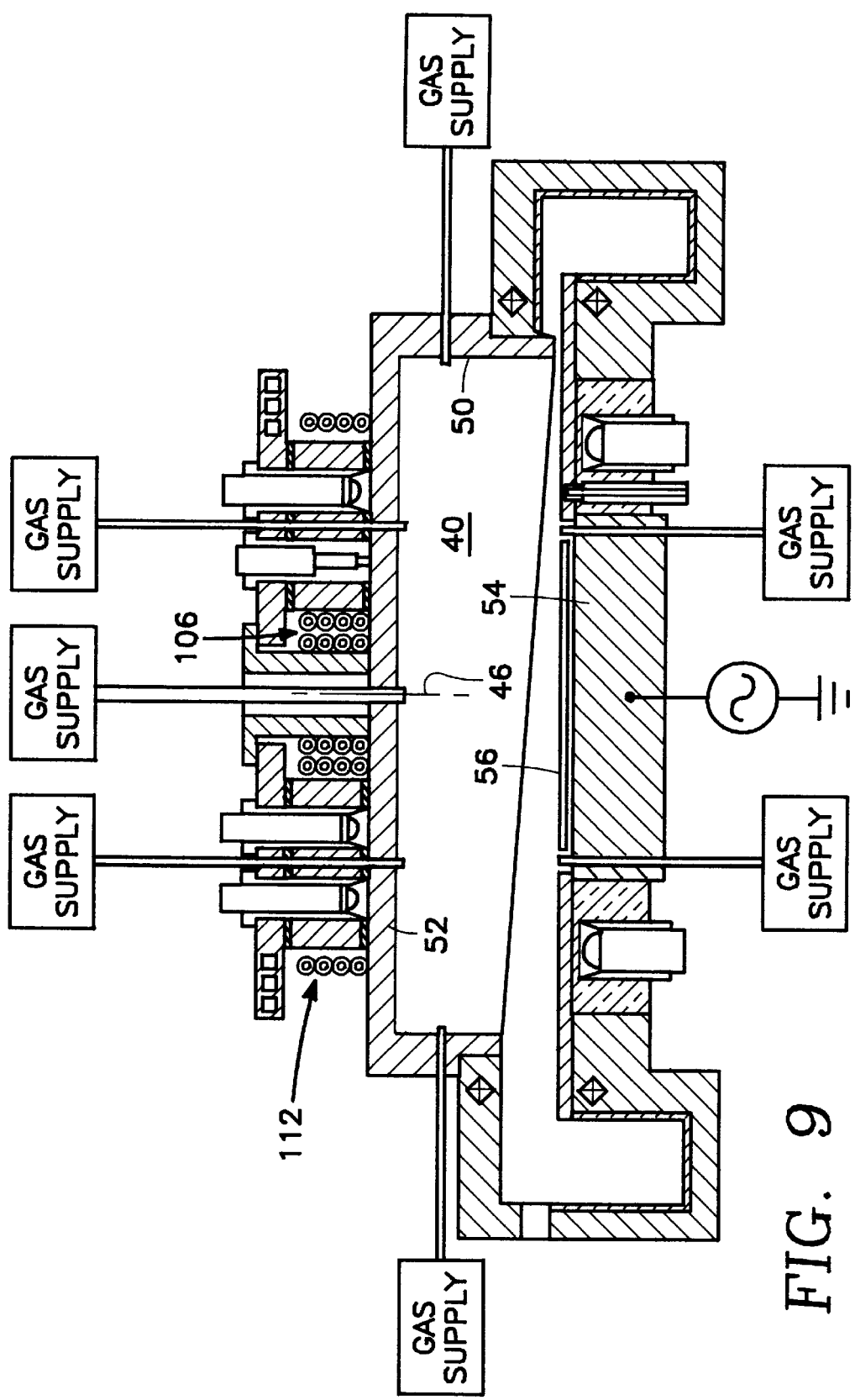
FIG. 9 is a cut-away side view of a plasma reactor corresponding to FIG. 5 in which the inner winding consists of plural upright cylindrical windings and the outer winding consists of a single upright cylindrical winding.

FIG. 9 illustrates a variation of the embodiment of FIG. 8 in which the outer doubly wound solenoid 110 is replaced by an ordinary outer solenoid 112 corresponding to the outer solenoid employed in the embodiment of FIG. 5.

Figure 10:
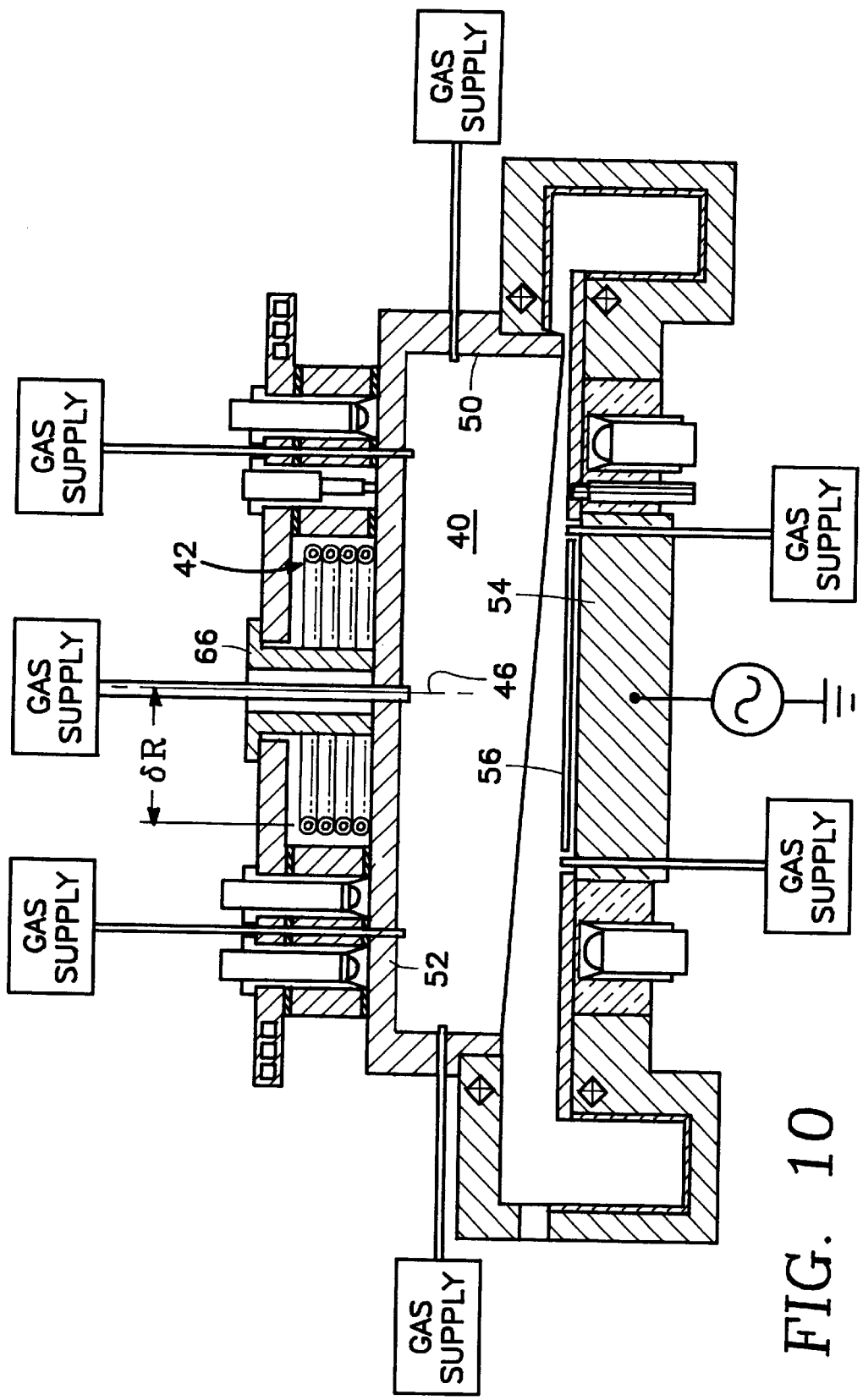
FIG. 10 is a cut-away side view of a plasma reactor in which a single solenoid winding is placed at an optimum radial position for maximum plasma ion density uniformity.

FIG. 10 illustrates another preferred embodiment in which the solenoid 42 of FIG. 5 is placed at a location displaced by a radial distance δr from the center gas feed housing 66. In the embodiment of FIG. 4, δr is zero while in the embodiment of FIG. 10 δr is a significant fraction of the radius of the cylindrical side wall 50. Increasing δr to the extent illustrated in FIG. 10 may be helpful as an alternative to the embodiments of FIGS. 4, 5, 7 and 8 for compensating for non-uniformities in addition to the usual center dip in plasma ion density described with reference to FIGS. 3D and 3E. Similarly, the embodiment of FIG. 10 may be helpful where placing the solenoid 42 at the minimum distance from the chamber center axis 46 (as in FIG. 4) would so increase the plasma ion density near the center of the wafer 56 as to over-correct for the usual dip in plasma ion density near the center and create yet another non-uniformity in the plasma process behavior. In such a case, the embodiment of FIG. 10 is preferred where δr is selected to be an optimum value which provides the greatest uniformity in plasma ion density. Ideally in this case, δr is selected to avoid both under-correction and over-correction for the usual center dip in plasma ion density. The determination of the optimum value for δr can be carried out by the skilled worker by trial and error steps of placing the solenoid 42 at different radial locations and employing conventional techniques to determine the radial profile of the plasma ion density at each step.

Figure 11:
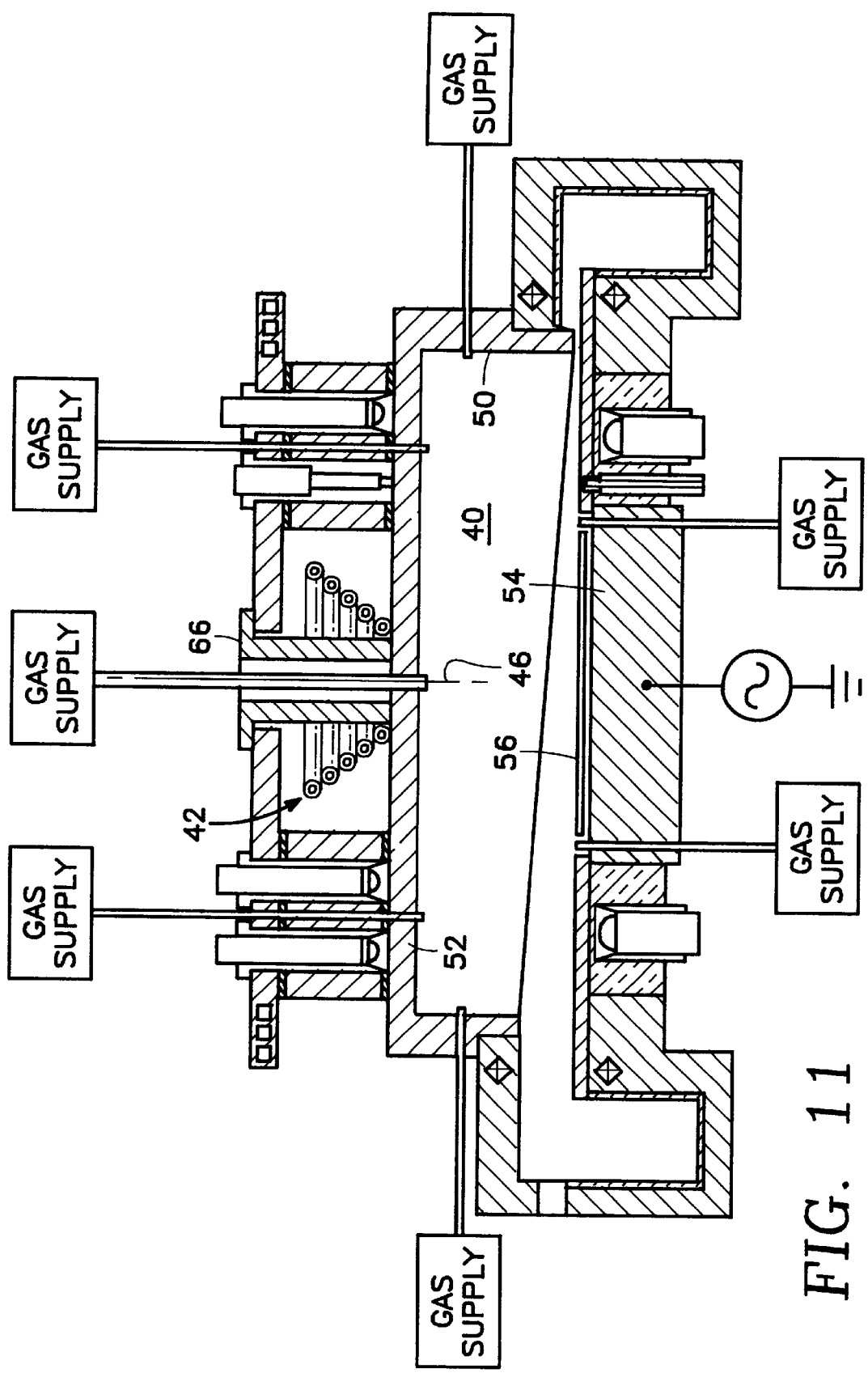
FIG. 11 is a cut-away side view of a plasma reactor corresponding to FIG. 4 in which the solenoid winding is an inverted conical shape.
Figure 12:
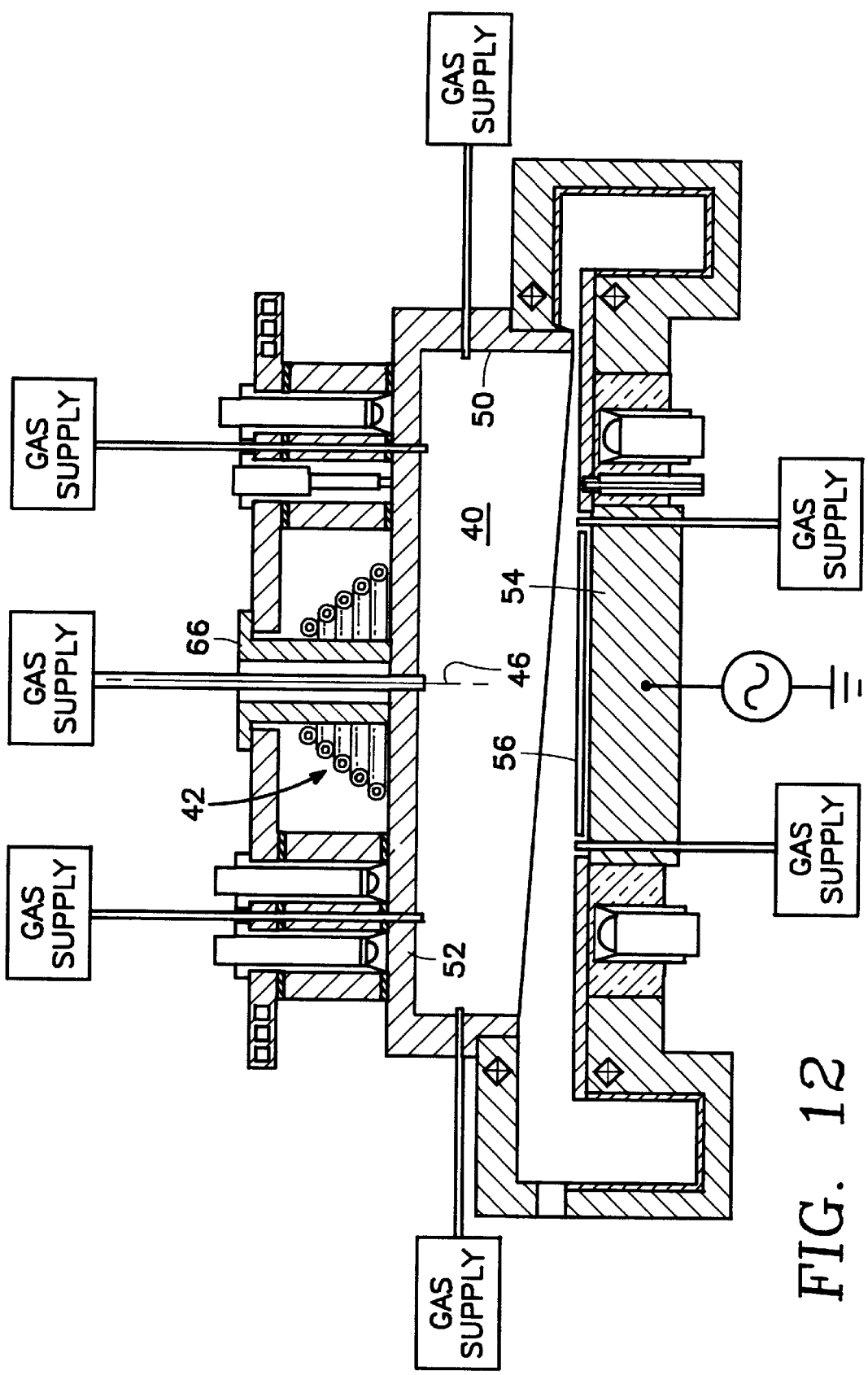
FIG. 12 is a cut-away side view of a plasma reactor corresponding to FIG. 4 in which the solenoid winding is an upright conical shape.

FIG. 11 illustrates an embodiment in which the solenoid 42 has an inverted conical shape while FIG. 12 illustrates an embodiment in which the solenoid 42 has an upright conical shape.

Figure 13:
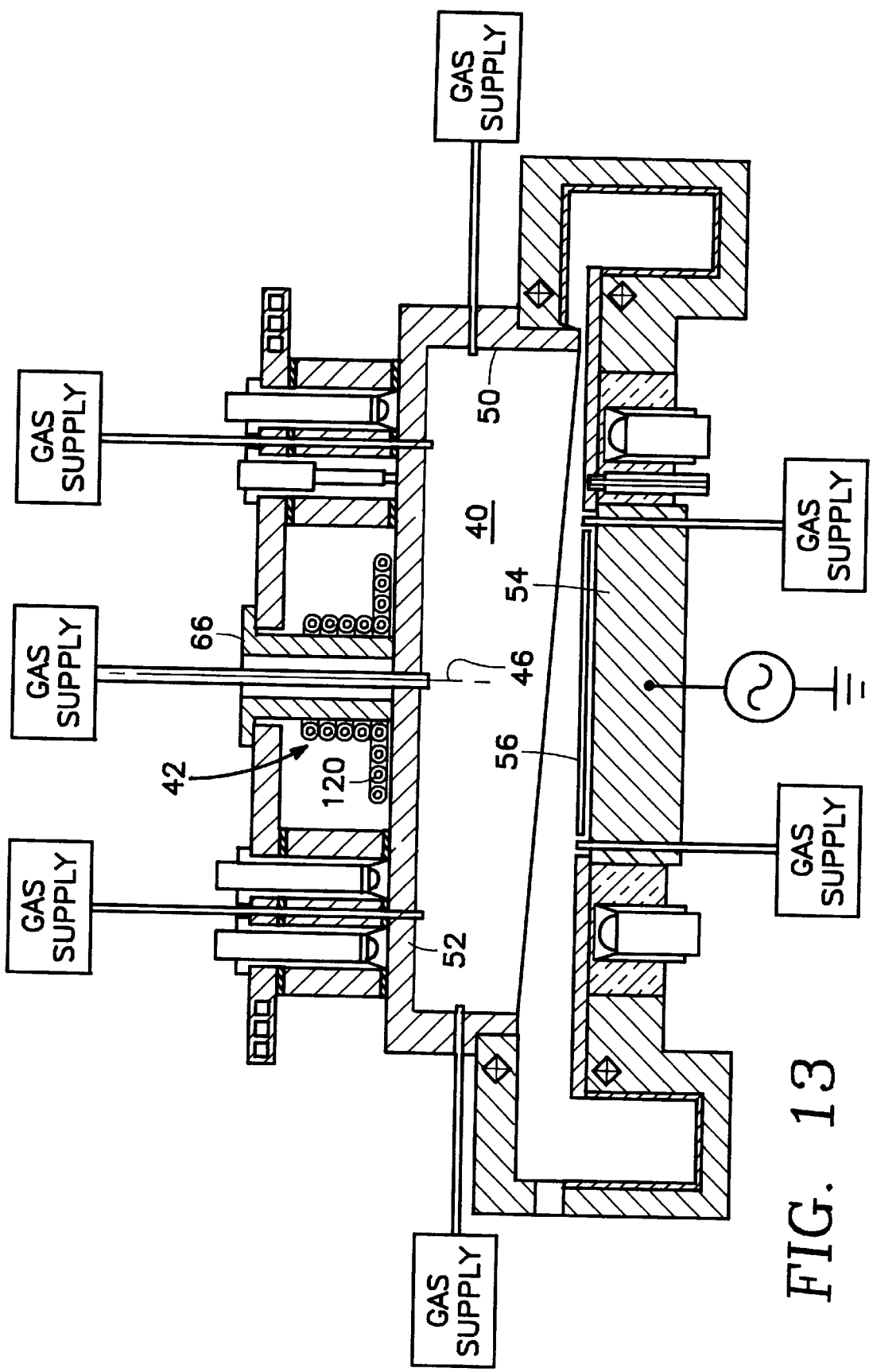
FIG. 13 is a cut-away side view of a plasma reactor in which the solenoid winding consists of an inner upright cylindrical portion and an outer flat portion.
Figure 14:
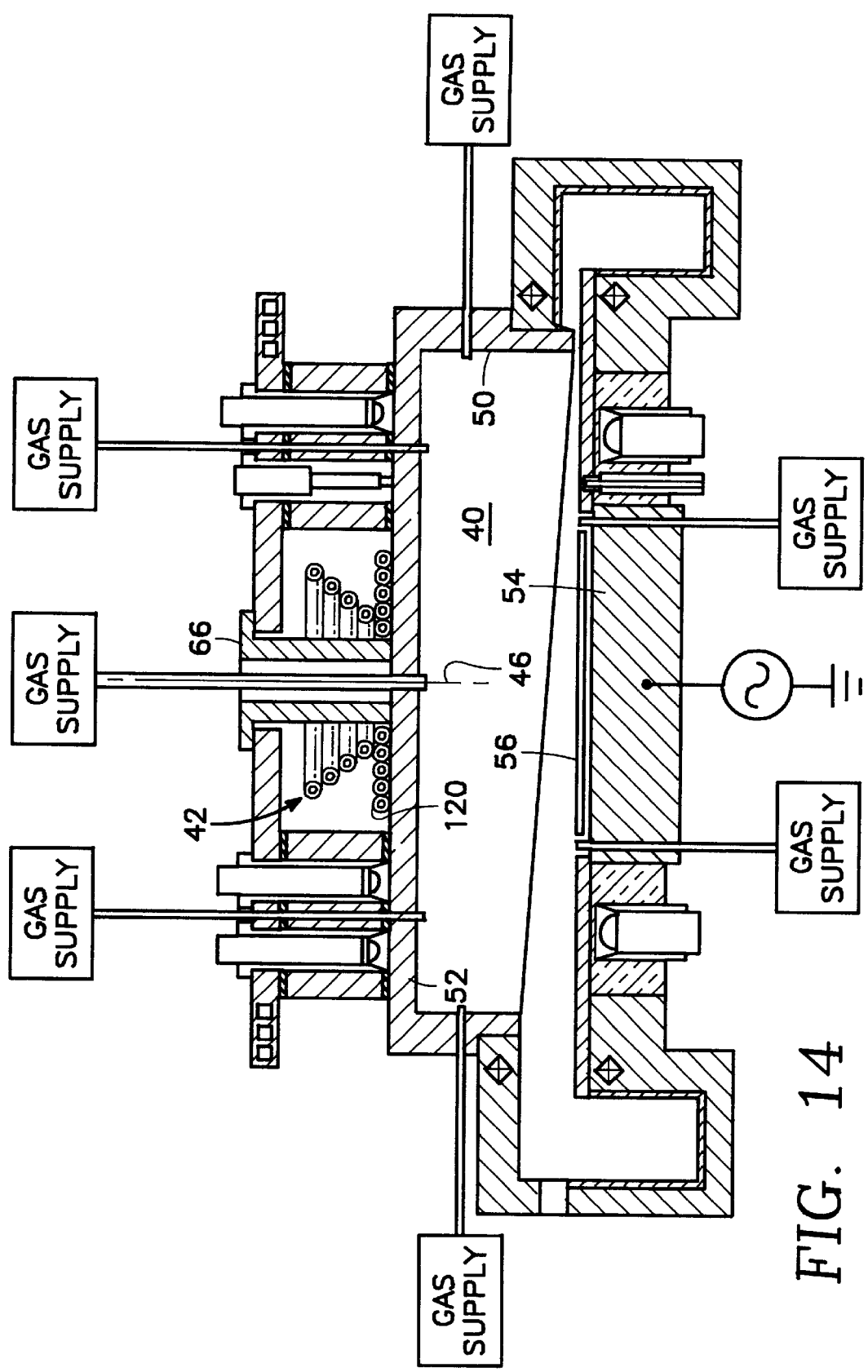
FIG. 14 is a cut-away side view of a plasma reactor corresponding to FIG. 10 in which the solenoid winding includes both an inverted conical portion and a flat portion.
Figure 15:
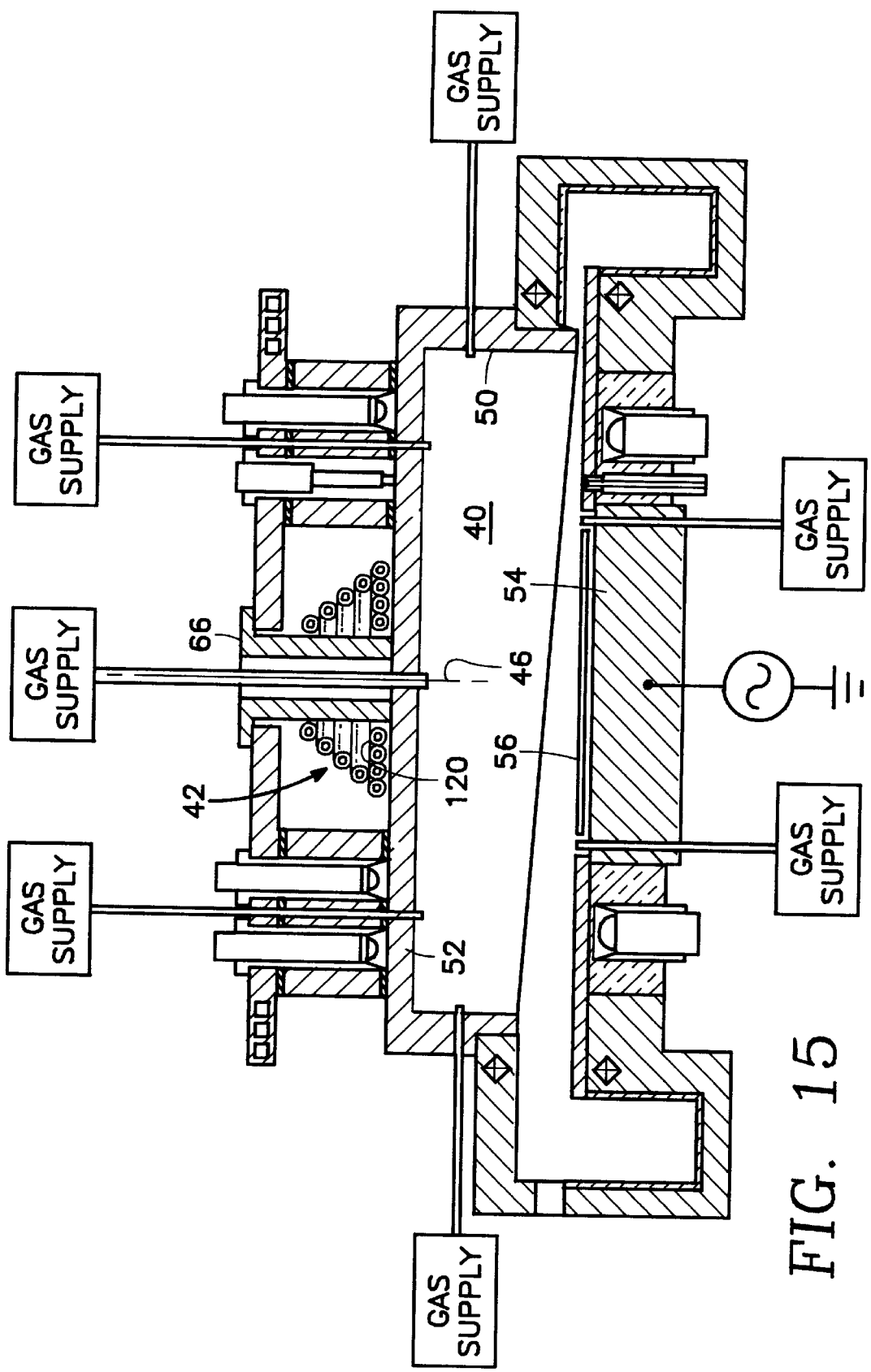
FIG. 15 is a cut-away side view of a plasma reactor corresponding to FIG. 12 in which the solenoid winding includes both an upright conical portion and a flat portion.

FIG. 13 illustrates an embodiment in which the solenoid 42 is combined with a planar helical winding 120. The planar helical winding has the effect of reducing the severity with which the solenoid winding 42 concentrates the induction field near the center of the workpiece by distributing some of the RF power somewhat away from the center. This feature may be useful in cases where it is necessary to avoid over-correcting for the usual center null. The extent of such diversion of the induction field away from the center corresponds to the radius of the planar helical winding 120. FIG. 14 illustrates a variation of the embodiment of FIG. 13 in which the solenoid 42 has an inverted conical shape as in FIG. 11. FIG. 15 illustrates another variation of the embodiment of FIG. 13 in which the solenoid 42 has an upright conical shape as in the embodiment of FIG. 12.

Figure 16:
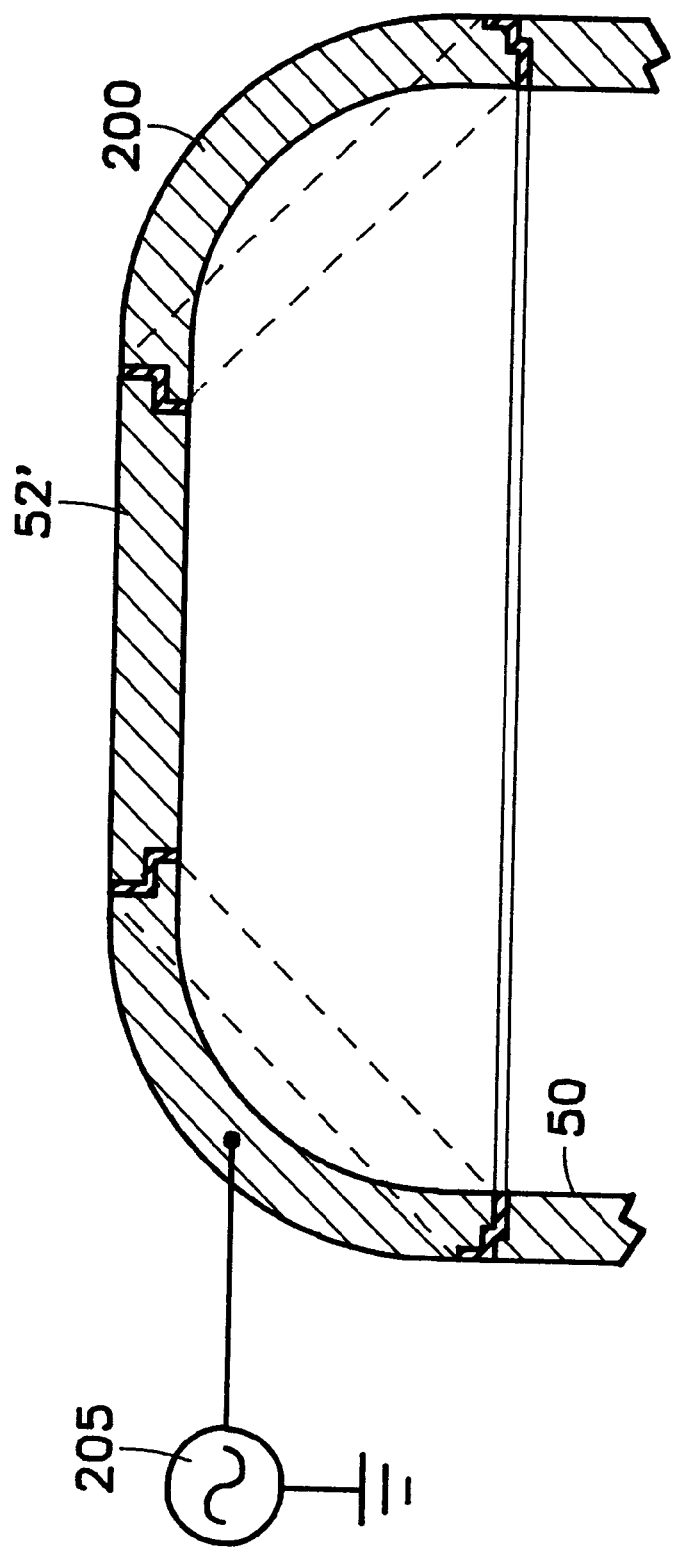
FIG. 16 illustrates a combination of planar, conical and dome-shaped ceiling elements.

The RF bias potential on the ceiling 52 may be applied directly (from an RF power source connected to the ceiling). Alternatively or in addition, an RF bias potential may be applied indirectly to the ceiling 52 by capacitive coupling from another electrode in the chamber. For example, the RF bias power directly applied to the wafer pedestal capacitively couples to the ceiling. In such a case, the RF potential on the ceiling 52 may be increased, for example to prevent polymer deposition thereon, by reducing its effective capacitive electrode area relative to other electrodes of the chamber (e.g., the workpiece and the sidewalls). FIG. 16 illustrates how this can be accomplished by supporting a smaller-area version of the ceiling 52' on an outer annulus 200, from which the smaller-area ceiling 52' is insulated. The annulus 200 may be formed of the same material (e.g., silicon) as the ceiling 52' and may be of a truncated conical shape (indicated in solid line) or a truncated dome shape (indicated in dashed line). A separate RF power supply 205 may be connected to the annulus 200 to permit more workpiece center versus edge process adjustments. Indirect application of RF bias power through capacitive coupling from another electrode may be used to bias not only the ceiling but also to bias the disposable silicon member 62 or any other scavenging or silicon-containing article in the chamber. Such indirect RF biasing may be employed in combination with or in lieu of a direct connection to a separate RF bias power source.

Figure 17A:
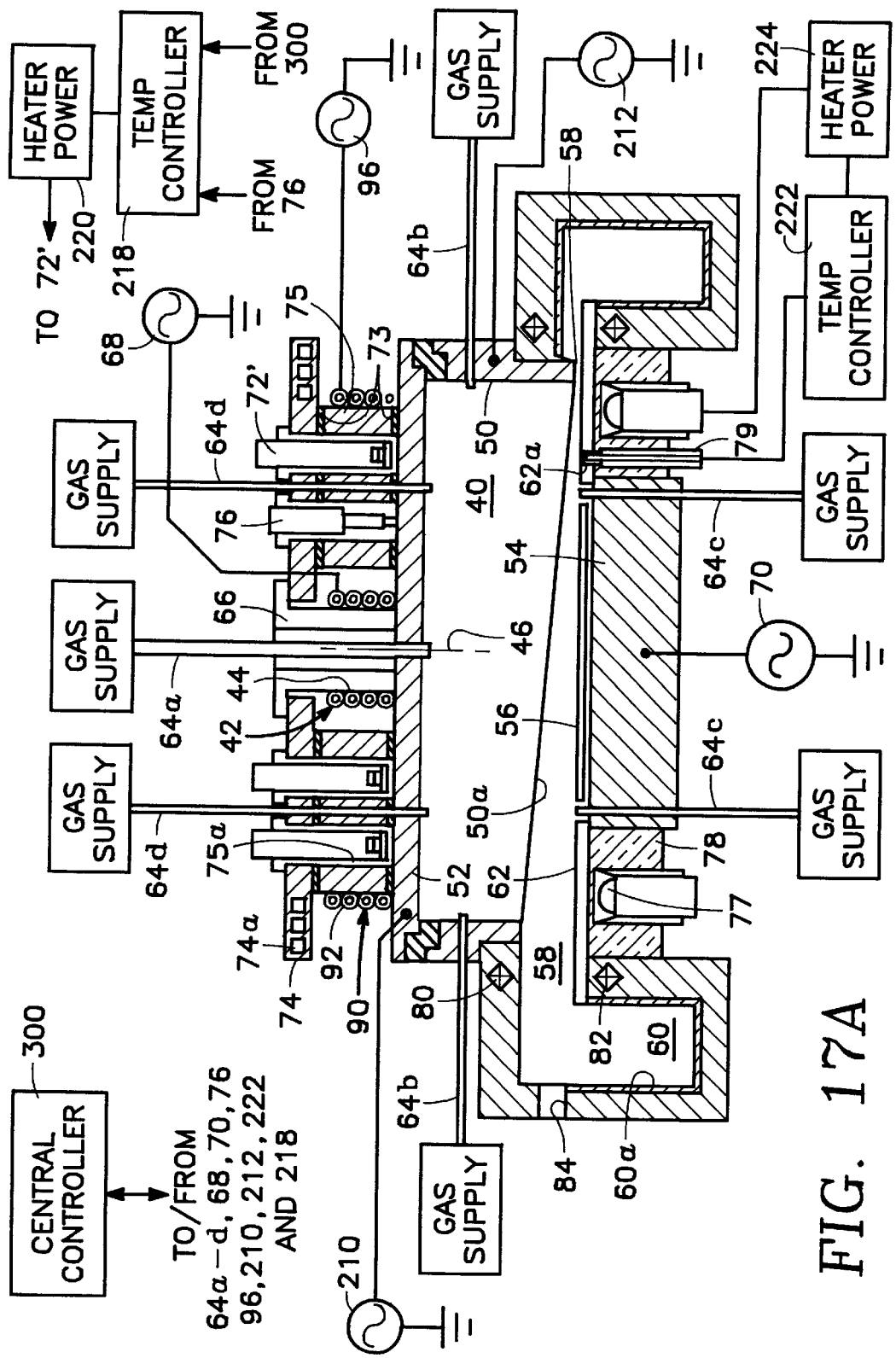
FIG. 17A illustrates a separately biased silicon side wall and ceiling and employing electrical heaters.

FIG. 17A illustrates a variation of the embodiment of FIG. 5 in which the ceiling 52 and side wall 50 are separate semiconductor (e.g., silicon) pieces insulated from one another having separately controlled RF bias power levels applied to them from respective RF sources 210, 212 to enhance control over the center etch rate and selectivity relative to the edge. As set forth in greater detail in above-referenced U.S. application Ser. No. 08/597,577 filed Feb. 2, 1996 by Kenneth S. Collins et al., the ceiling 52 may be a semiconductor (e.g., silicon) material doped so that it will act as an electrode capacitively coupling the RF bias power applied to it into the chamber and simultaneously as a window through which RF power applied to the solenoid 42 may be inductively coupled into the chamber. The advantage of such a window-electrode is that an RF potential may be established directly over the wafer (e.g., for controlling ion energy) while at the same time inductively coupling RF power directly over the wafer. This latter feature, in combination with the separately controlled inner and outer solenoids 42, 90 and center and peripheral gas feeds 64a, 64b greatly enhances the ability to adjust various plasma process parameters such as ion density, ion energy, etch rate and etch selectivity at the workpiece center relative to the workpiece edge to achieve an optimum uniformity. In this combination, gas flow rates through individual gas feeds are individually and separately controlled to achieve such optimum uniformity of plasma process parameters.

FIG. 17A illustrates how the lamp heaters 72 may be replaced by electric heating elements 72'. As in the embodiment of FIG. 4, the disposable silicon member is an annular ring 62 surrounding the pedestal 54. Preferably, the annular ring 62 is high purity silicon and may be doped to alter its electrical or optical properties. In order to maintain the silicon ring 62 at a sufficient temperature to ensure its favorable participation in the plasma process (e.g., its contribution of silicon material into the plasma for fluorine scavenging), plural radiant (e.g., tungsten halogen lamp) heaters 77 arranged in a circle under the annular ring 62 heat the silicon ring 62 through a quartz window 78. As described in the above-referenced co-pending application, the heaters 77 are controlled in accordance with the measured temperature of the silicon ring 62 sensed by a temperature sensor 79 which may be a remote sensor such as an optical pyrometer or a fluoro-optical probe. The sensor 79 may extend partially into a very deep hole 62a in the ring 62, the deepness and narrowness of the hole tending at least partially to mask temperature-dependent variations in thermal emissivity of the silicon ring 62, so that it behaves more like a gray-body radiator for more reliable temperature measurement.

Figure 17B:
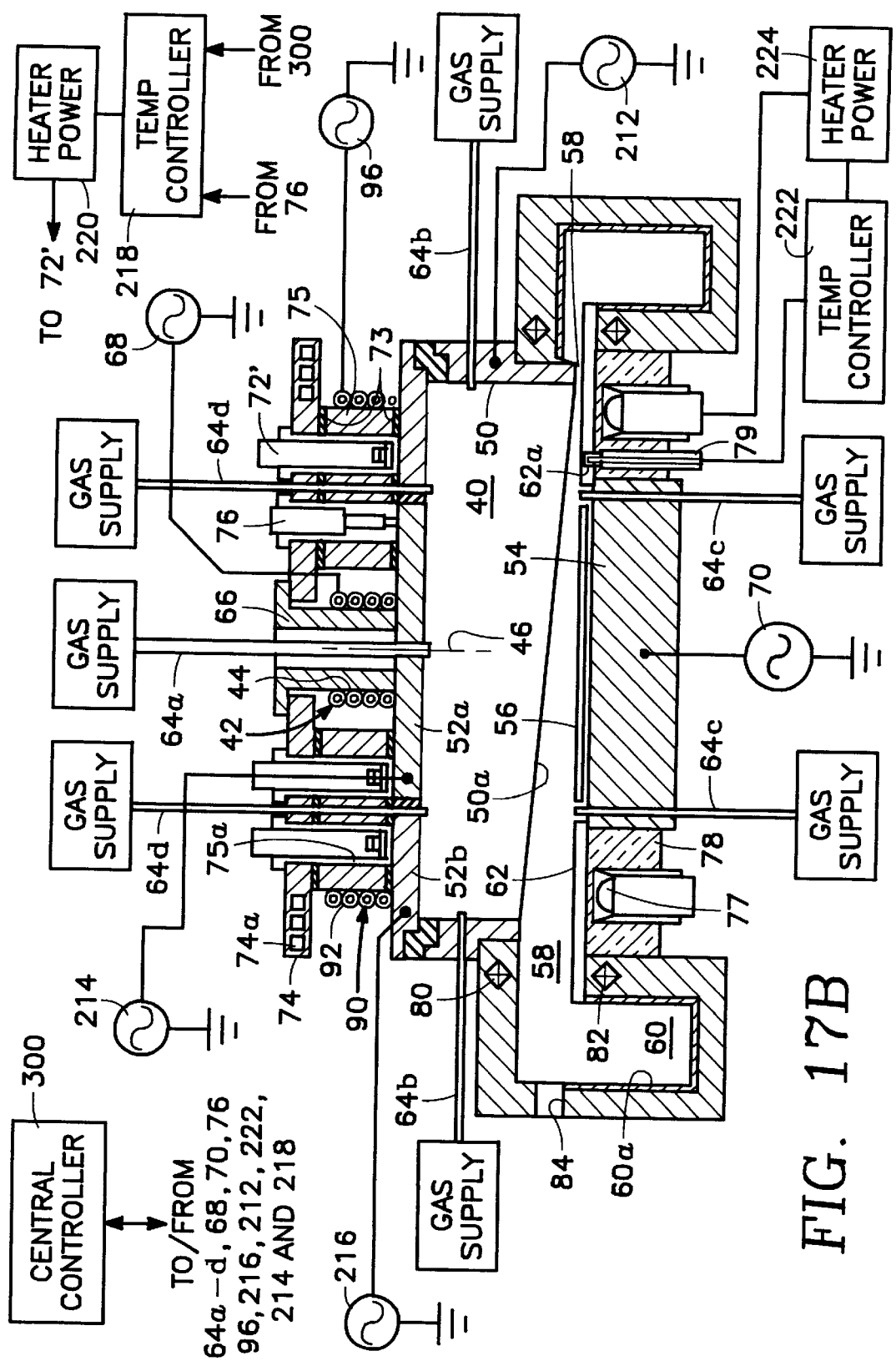
FIG. 17B illustrates separately biased inner and outer silicon ceiling portions and employing electrical heaters.

FIG. 17B illustrates another variation in which the ceiling 52 itself may be divided into an inner disk 52a and an outer annulus 52b electrically insulated from one another and separately biased by independent RF power sources 214, 216 which may be separate outputs of a single differentially controlled RF power source.

In accordance with an alternative embodiment, a user-accessible central controller 300 shown in FIGS. 17A and 17B, such as a programmable electronic controller including, for example, a conventional microprocessor and memory, is connected to simultaneously control gas flow rates through the central and peripheral gas feeds 64a, 64, RF plasma source power levels applied to the inner and outer antennas 42, 90 and RF bias power levels applied to the ceiling 52 and side wall 50 respectively (in FIG. 17A) and the RF bias power levels applied to the inner and outer ceiling portions 52a, 52b (in FIG. 17B), temperature of the ceiling 52 and the temperature of the silicon ring 62. A ceiling temperature controller 218 governs the power applied by a lamp power source 220 to the heater lamps 72' by comparing the temperature measured by the ceiling temperature sensor 76 with a desired temperature known to the controller 300. A ring temperature controller 222 controls the power applied by a heater power source 224 to the heater lamps 77 facing the silicon ring 62 by comparing the ring temperature measured by the ring sensor 79 with a desired ring temperature stored known to the controller 222. The master controller 300 governs the desired temperatures of the temperature controllers 218 and 222, the RF power levels of the solenoid power sources 68, 96, the RF power levels of the bias power sources 210, 212 (FIG. 17A) or 214, 216 (FIG. 17B), the wafer bias level applied by the RF power source 70 and the gas flow rates supplied by the various gas supplies (or separate valves) to the gas inlets 64a–d. The key to controlling the wafer bias level is the RF potential difference between the wafer pedestal 54 and the ceiling 52. Thus, either the pedestal RF power source 70 or the ceiling RF power source 212 may be simply a short to RF ground. With such a programmable integrated controller, the user can easily optimize apportionment of RF source power, RF bias power and gas flow rate between the workpiece center and periphery to achieve the greatest center-to-edge process uniformity across the surface of the workpiece (e.g., uniform radial distribution of etch rate and etch selectivity). Also, by adjusting (through the controller 300) the RF power applied to the solenoids 42, 90 relative to the RF power difference between the pedestal 54 and ceiling 52, the user can operate the reactor in a predominantly inductively coupled mode or in a predominantly capacitively coupled mode.

While the various power sources connected in FIG. 17A to the solenoids 42, 90, the ceiling 52, side wall 50 (or the inner and outer ceiling portions 52a, 52b as in FIG. 17B) have been described as operating at RF frequencies, the invention is not restricted to any particular range of frequencies, and frequencies other than RF may be selected by the skilled worker in carrying out the invention.

In a preferred embodiment of the invention, the high thermal conductivity spacer 75, the ceiling 52 and the side wall 50 are integrally formed together from a single piece of crystalline or polycrystalline silicon or silicon carbide.

DETAILED DESCRIPTION RELATING TO THE PRESENT INVENTION

In order to increase photoresist selectivity and reduce photoresist "faceting" during silicon oxide plasma etch processing in a high density plasma reactor, the chamber pressure is increased to a relatively high chamber pressure (for a high density or inductively coupled plasma) by adding a non-reactive diluent gas without a concomitant reduction in vacuum pump rate. The regime of "high pressure" for a high density or inductively coupled plasma may be defined in one of two ways: (a) a pressure at which the inductive field skin depth is greater than $\frac{1}{10}$ of the coil-to-workpiece gap, or (b) a pressure range greater than 20 mT and extending up to several hundred mT.

Preferably, the etchant/polymer precursor gas is fed into the chamber at a gas flow rate which, by itself, would maintain the chamber pressure below the high pressure regime, and the non-reactive gas is added at a flow rate which, in combination with the flow rate of the precursor gas, is sufficient to raise the chamber pressure into the high pressure regime. By thus refraining from significantly throttling back the chamber vacuum pump, the polymer precursor residence time in the chamber is not greatly increased. The present invention increases the chamber pressure to increase polymer strength and thereby reduce photoresist faceting without increasing the residence time of the polymer precursor gas in the chamber to avoid etchstopping polymer build-up on the silicon dioxide surfaces. The result is a net increase in the process window, a significant advantage.

In one embodiment of the present invention, the gases supplied to the chamber are as follows: 90 standard cubic centimeters per minute (SCCM) of $CHF_3$ as an etchant/polymer precursor favoring etching, 10 SCCM of $C_4F_8$ as an etchant/polymer precursor favoring polymerization, 16 SCCM of $CO_2$ as an etch stop inhibitor, and 450 SCCM of argon as the non-reactive species added to increase the chamber pressure (within a range of 70–100 mT) without greatly decreasing the chamber pump rate. In general, the gas flow rate into the chamber of the non-reactive species is greater than about one-half the total flow rates of all gases into the chamber. In an alternative (but not necessarily preferred) embodiment, the flow rate of the non-reactive species is greater than about 0.3 of the total flow rate of all gases into the chamber. In another preferred embodiment, the flow rate of the non-reactive species is 0.7 of the total flow rate of all gases into the chamber.

Preferably, the process is carried out in the plasma reactors disclosed in the above-referenced parent application because the multiple solenoid coil antenna feature provides the greatest uniformity of plasma ion distribution. However, the same process of generating an inductively coupled high density RF plasma in a carbon-fluorine chemistry at high pressure with a large proportion of non-reactive diluent gas can be carried out in other reactors, such as one with a planar coil antenna over a dielectric ceiling.

The process of the invention includes embodiments in which a fluorine scavenger is provided in the chamber to enhance polymerization or passivation of the non-oxygen-containing surfaces on the workpiece. It has already been described how the chamber ceiling may be formed of silicon or silicon carbide. If the temperature of this form of the ceiling is maintained sufficiently high to keep the ceiling free of polymer accumulation, then the ceiling itself can donate fluorine scavenging species (silicon or carbon) into the plasma by plasma ion collisions ablating such material from the ceiling. Alternatively, fluorine scavenger species may be introduced by supplying a silicon-containing gas (e.g., silane, tetraethoxysilane, diethylsilane or silicon tetrafluoride) into the chamber. In this case the temperature of the ceiling, wall or fluorine-scavenger precursor ring 62 may be reduced to permit polymer accumulation thereon to slow down or prevent removal of material therefrom. Alternatively, the fluorine-scavenging gas may be a hydrogen-containing gas, such as silane (already mentioned in the silicon-containing category), pure hydrogen gas, a hydrocarbon gas such as methane, hydrogen fluoride or a fluoro-hydrocarbon gas.

The process of the invention may be adjusted by changing the non-reactive diluent gas to a higher or lower atomic weight gas. For example, helium or neon requires more plasma electron energy to ionize than does xenon, so that with xenon a plasma with lower mean electron temperature and higher electron density results, yielding more etch precursor species and providing a higher etch rate. As a result, with xenon the etch rate is very high and there is poor oxide-to-photoresist etch selectivity. Conversely, with helium or neon the etch rate is lower (a possible disadvantage) while the etch selectivity is superior. An ideal balance is achieved with a medium atomic weight inert gas such as argon which provides both a good etch rate and a good etch selectivity. However, helium, neon, argon or zenon or other relatively non-reactive gases may be used as diluent gases. One skilled in the art may adjust gas flow rate of the diluent species relative to the reactive species gas flow rates to optimize the etch rate and etch selectivity. In general, a high ratio of non-reactive gases to polymer precursor gases adjusts the process to reduce etch selectivity at constant pressure with less etch stopping.

The process of the invention is also adjusted with the ceiling temperature. For example, in one embodiment of the invention, the ceiling is heated to a high temperature—near the polymer condensation temperature—so that more polymer deposits on the passivated surfaces of the wafer and less on the ceiling. In this case, in order to avoid etch stopping on the oxide surfaces typical at high chamber pressures, either: (a) dilution of the polymer precursor gases is desirably increased as the temperatures of the ceiling, wall and/or polymer precursor ring are increased and/or (b) the etch stop inhibitor gas flow rate is desirably increased. The diluent gas content is desirably at least about 50% or more of the gases in the chamber.

Conversely, if the ceiling is cooled well below the polymer condensation temperature, the diluent content may be reduced well below the 50% level.

Other adjustments may be effected to increase or decrease the rate of polymerization by increasing the relative proportion of high carbon-content polymer/etchant precursor gases in the chamber (e.g., $C_4F_8$)—to increase polymerization—or by increasing the relative proportion of high fluorine content polymer/etchant precursor gases (e.g., $CHF_3$)—to increase etch rate. As the proportion of high carbon-content precursor gases is increased, the proportion of non-reactive diluent gas (e.g., argon) and/or etch stop inhibition gases (e.g., $CO_2$, $CO$ or $O_2$) should be increased to avoid etch-stopping on the oxide surfaces. The etch stop inhibitor gas may be omitted if a sufficiently high ratio of relatively non-reactive diluent gas flow rate to reactive gas flow rate is used.

The foregoing embodiments of the process of the present invention are preferably carried out in one of the reactors disclosed hereinabove, such as the reactors of FIGS. 5, 17A, 17B, for example. This is because such reactors provide optimum plasma ion density distribution uniformity. However other reactors may be employed in carrying out the process. For example, the process may be carried out in a plasma reactor of the type having a planar ceiling and planar overhead inductive coil. Such a plasma reactor is illustrated in FIG. 1. However, in the following detailed description of the process, the working examples given are specifically applicable to the preferred reactor chamber of FIG. 17A.

Working Example

Reactor Parameter Settings:
$CHF_3$ gas flow rate: 90 sccm
$C_4F_8$ gas flow rate: 10 sccm
$CO_2$ gas flow rate: 16 sccm
Ar gas flow rate: 450 sccm
total chamber pressure: 85–90 mTorr
chamber surface temperature: 1500° C.
silicon ring temperature: 450° C.
plasma volume: 6.5 liters
chamber volume: 22 liters
outer coil power: 3072 watts @ 2.0 MHz
inner coil power: 1178 watts @ 2.3 MHz
bias power to pedestal: 1600 watts @ 1.8 MHz
wafer on electrostatic chuck at −10° C. w/helium cooling gas In this example, a vacuum pump which pumped down the chamber pressure was a conventional turbopump of the type having a nominal capacity of 1000 liters/second with a net flow rate of 300 liters/second at a chamber pressure of 10 mT and a net flow rate of 110 liters/second at a chamber pressure of 100 mT. A throttle valve at the pump intake from the chamber was 18% open in this example.

Results:
(1) deep oxide contact holes etched at 0.4 micron diameter at approximately 10,000 angstroms/minute with etch stopping;
(2) oxide to photoresist selectivity is approximately 5:1 at the photoresist facets;
(3) polysilicon loss in shallow oxide contact holes (which are 3000–4000 angstroms deep) was approximately 100 angstroms.

The invention is not at all restricted to the specific values to which reactor parameters were set in the foregoing example, and in fact such parameters may be varied within given ranges in carrying out the invention. The parameters affecting plasma ion density, such as the various RF power levels and frequencies applied to the inner and outer coils may be represented by the resulting plasma ion density. The invention can be carried out at a plasma ion density near the wafer surface exceeding $10^{10}$ ions per cubic centimeter (ions/cc). Preferably, however, the invention is carried out at a plasma ion density near the wafer surface, specifically in excess of $10^{11}$ ions/cc. Such relatively high plasma ion densities are typically achieved in an inductively coupled RF plasma reactor. A preferred reactor of this type is disclosed in this specification. Therefore, the requisite plasma ion density range is assured by carrying out the invention in an inductively coupled RF plasma.

While a relatively low chamber pressure relative to conventional plasma reactors is typically less than about 20 mT, the invention is carried out at a relatively high chamber pressure increased above the low pressure at least in part by the addition of the diluent non-reactive gas, as described above in this specification. The invention can be carried out at a relatively high chamber pressure in excess of 20 mT. Better results can be attained by carrying out the invention at a chamber pressure in excess of 50 mT. Preferably, however, the invention is carried out at a chamber pressure in excess of 100 mT. Such chamber pressure requirements can be summarized in the resulting effect on the skin depth of the inductive field in the plasma. Specifically, it is preferable that the chamber pressure be sufficiently high to maintain the skin depth nearly equal to or greater than 1/10 of the displacement or gap between the wafer or workpiece and the inductive antenna.

The invention has been described with reference to embodiments in which the chamber pressure is increased from a lower pressure range (e.g., below about 20 mT) to the higher pressure ranges discussed hereinabove by the addition of the diluent relatively non-reactive gas. Such an increase in chamber pressure may be achieved either by the addition of the diluent gas alone or by a combination of the addition of the diluent gas and a change in pump flow rate (e.g., by reducing the opening size of the vacuum pump throttle valve). In either case, the diluent gas flow rate into the chamber is preferably at least one half the total of all gas flow rates into the reactor chamber, so that the introduction of the diluent gas plays a predominant role in raising the chamber pressure into the higher pressure range, while the reduction in the pump flow rate (throttle valve position)—if any—plays a minor role. With or without such a reduction in vacuum pump rate (throttle valve area), the diluent gas flow is sufficient by itself to achieve the increase in chamber pressure to at least one of the higher pressure ranges discussed hereinabove. Thus, the invention may be carried out by the introduction of the diluent gas in combination with a relatively small reduction in throttle valve opening area ranging from no reduction to a finite reduction. The reduction in throttle valve opening may be stated as a fraction of the throttle valve opening corresponding to the lower chamber pressure in the absence of the diluent gas flow. In the working example given above, the throttle valve opening was 18% open, which is about 9/10 of the throttle valve opening at a lower chamber pressure of 20 mT in the absence of the diluent gas flow into the chamber.

While the invention has been described in detail by specific reference to preferred embodiments, it is understood that variations and modifications thereof may be made without departing from the true spirit and scope of the invention.

What is claimed is:

1. A method of performing an etch process on a semiconductor workpiece in a plasma reactor chamber, comprising:

providing a vacuum pump having a vacuum pump rate to evacuate the plasma reactor chamber;

supplying a polymer and etchant precursor gas containing at least carbon and fluorine into said chamber at a first flow rate sufficient of itself to maintain a gas pressure in said chamber in a low pressure range below about 20 mT;

establishing a high pressure range above 20 mT within said chamber for performing said etch process to define an etch structure comprising increasing said gas pressure in said chamber from said low pressure range to said high pressure range by adding a relatively non-reactive gas into said chamber at a second flow rate sufficient, in combination with the first flow rate of said precursor gas, to maintain said gas pressure in said high pressure range without requiring a decrease in the vacuum pump rate so as to increase polymer passivation strength without otherwise significantly increasing polymer precursor residence time;

continuously maintaining said gas pressure in said high pressure range during said etch process by continuously adding said relatively non-reactive gas into said chamber at said second flow rate; and applying plasma source power into said chamber to form a high ion density plasma having an ion density in excess of $10^{10}$ ions per cubic centimeter.

2. The method of claim 1 wherein said high pressure range is in excess of 50 mT.

3. The method of claim 1 wherein said high pressure range is in excess of 100 mT.

4. The method of claim 1 wherein said ion density is in excess of $10^{11}$ ions per cubic centimeter.

5. The method of claim 4 wherein said high pressure range is in excess of 50 mT.

6. The method of claim 4 wherein said high pressure range is in excess of 100 mT.

7. The method of claim 1 wherein said applying plasma source power comprises inductively coupling plasma power into said chamber.

8. The method of claim 1 wherein said workpiece comprises an oxygen-containing overlayer to be etched by said process and a non-oxygen-containing underlayer to be protected from etching, said precursor gas dissociating in said plasma into fluorine-containing etchant species which etch said oxygen-containing layer and carbon-containing polymer species which accumulate on said non-oxygen-containing underlayer.

9. The method of claim 8 further comprising providing a source of fluorine scavenging species in said chamber.

10. The method of claim 9 wherein said source of said fluorine scavenging species comprises a solid article in said chamber.

11. The method of claim 9 wherein said source of said fluorine scavenging species comprises a gas introduced into said chamber.

12. The method of claim 8 further comprising supplying an etch stop inhibitor gas into said reactor chamber.

13. The method of claim 8 wherein said non-reactive gas comprises one of: (a) argon, (b) helium, (c) neon, (d) xenon.

14. The method of claim 8 further comprising applying RF bias power to said workpiece to control plasma ion energy.

15. The method of claim 14 wherein said plasma ion energy is sufficient to suppress net polymer accumulation on non-oxygen containing surfaces of said workpiece.

16. The method of claim 9 wherein said source of fluorine scavenger species comprises a solid silicon-containing material.

17. The method of claim 9 wherein said source of fluorine scavenger species comprises a solid carbon-containing material.

18. The method of claim 9 wherein said providing a source of fluorine scavenging species comprises introducing a scavenger species-containing gas into said chamber.

19. The method of claim 1 wherein said second flow rate is at least about 0.5 of the total flow rates of all gases supplied into said reactor chamber.

20. The method of claim 1 wherein said second flow rate is at least about 0.3 of the total flow rate of all gases supplied into said reactor chamber.

21. The method of claim 1 wherein said etchant and polymer precursor gas comprises a low-carbon content etchant and polymer precursor gas and a high-fluorine content etchant and polymer precursor gas in a ratio which provides a desired apportionment between polymer accumulation on said workpiece and polymer removal from said workpiece.

22. The method of claim 1 wherein the said gas pressure in said high pressure range is not decreased during said etch process.

23. A method of performing an etch process on a workpiece in a plasma reactor chamber, comprising:

supplying a polymer and etchant precursor gas containing at least carbon and fluorine into said chamber at a first flow rate sufficient of itself to maintain a gas pressure in said chamber in a low pressure range below about 20 mT;

establishing a high pressure range above 20 mT within said chamber for performing said etch process to define an etch structure by increasing said gas pressure in said chamber from said low pressure range to said high pressure range by adding a relatively non-reactive gas into said chamber at a second flow rate sufficient, in combination with the first flow rate of said precursor gas, to maintain said gas pressure in said high pressure range without requiring a decrease in the vacuum pump rate so as to increase polymer passivation strength without otherwise significantly increasing polymer precursor residence time;

continuously maintaining said gas pressure in said high pressure range during said etch process by continuously adding said relatively non-reactive gas into said chamber at said second flow rate; and applying plasma source power into said chamber to form a high ion density plasma having an ion density in excess of $10^{10}$ ions per cubic centimeter.

24. The method of claim 23 wherein said gas pressure in said high pressure range is not decreased during said etch process.

* * * * *